(12) United States Patent
Miyazaki

(10) Patent No.: US 7,043,391 B2
(45) Date of Patent: May 9, 2006

(54) USER INTERFACE FOR SEMICONDUCTOR EVALUATION DEVICE

(76) Inventor: Shuji Miyazaki, 2-18-14, Ekoda, Aoba-Ku, Yokohama-shi, Kanagawa 225-0005 (JP)

( * ) Notice: Subject to any disclaimer, the term of this patent is extended or adjusted under 35 U.S.C. 154(b) by 71 days.

(21) Appl. No.: 10/468,126

(22) PCT Filed: Feb. 8, 2002

(86) PCT No.: PCT/JP02/01090

§ 371 (c)(1),
(2), (4) Date: Oct. 29, 2003

(87) PCT Pub. No.: WO02/065544

PCT Pub. Date: Aug. 22, 2002

(65) Prior Publication Data

US 2004/0122605 A1    Jun. 24, 2004

(30) Foreign Application Priority Data

Feb. 16, 2001    (JP) .............................. 2001-040283

(51) Int. Cl.
*G06F 19/00* (2006.01)
(52) U.S. Cl. .............................. 702/120; 438/14; 716/4
(58) Field of Classification Search ................. 702/35, 702/36, 81–84, 117–123, 127, 170, 172; 438/14; 716/4; 324/765; 700/121
See application file for complete search history.

(56) References Cited

U.S. PATENT DOCUMENTS

| | | | | |
|---|---|---|---|---|
| 4,967,381 A * | 10/1990 | Lane et al. .................... 702/81 |
| 5,390,131 A * | 2/1995 | Rohrbaugh et al. ............. 716/4 |
| 6,037,793 A * | 3/2000 | Miyazawa et al. ........... 324/760 |
| 6,162,006 A * | 12/2000 | Stevens et al. ......... 414/416.03 |
| 6,303,398 B1 * | 10/2001 | Goerigk ........................ 438/14 |
| 6,363,294 B1 * | 3/2002 | Coronel et al. .............. 700/121 |
| 6,639,417 B1 * | 10/2003 | Takao .......................... 324/765 |
| 6,833,048 B1 * | 12/2004 | Finarov et al. ......... 156/345.24 |

* cited by examiner

*Primary Examiner*—Marc S. Hoff
*Assistant Examiner*—Mohamed Charioui
(74) *Attorney, Agent, or Firm*—Oliff & Berridge, PLC

(57) ABSTRACT

The present invention is a user interface of the semiconductor evaluation device, which evaluates the characteristics of the semiconductor elements on a wafer. This user interface provides means on which a setting window is displayed in order to conduct the setting of the measurement conditions to each setting object having a hierarchical relation, means on which a main setting window is displayed to manage the setting window, means to save in a file the measurement conditions set in the setting window, and means to load the measurement conditions that are set in the first setting window for the first setting object and saved in a file for the second setting window to the second setting object, which is located at higher level than the first setting window and is able to set up selectively to the user the measurement conditions loaded in the second setting window. As a result, the user becomes set up systematically the measurement conditions necessary for conducting characteristics evaluation of the semiconductor elements.

15 Claims, 43 Drawing Sheets

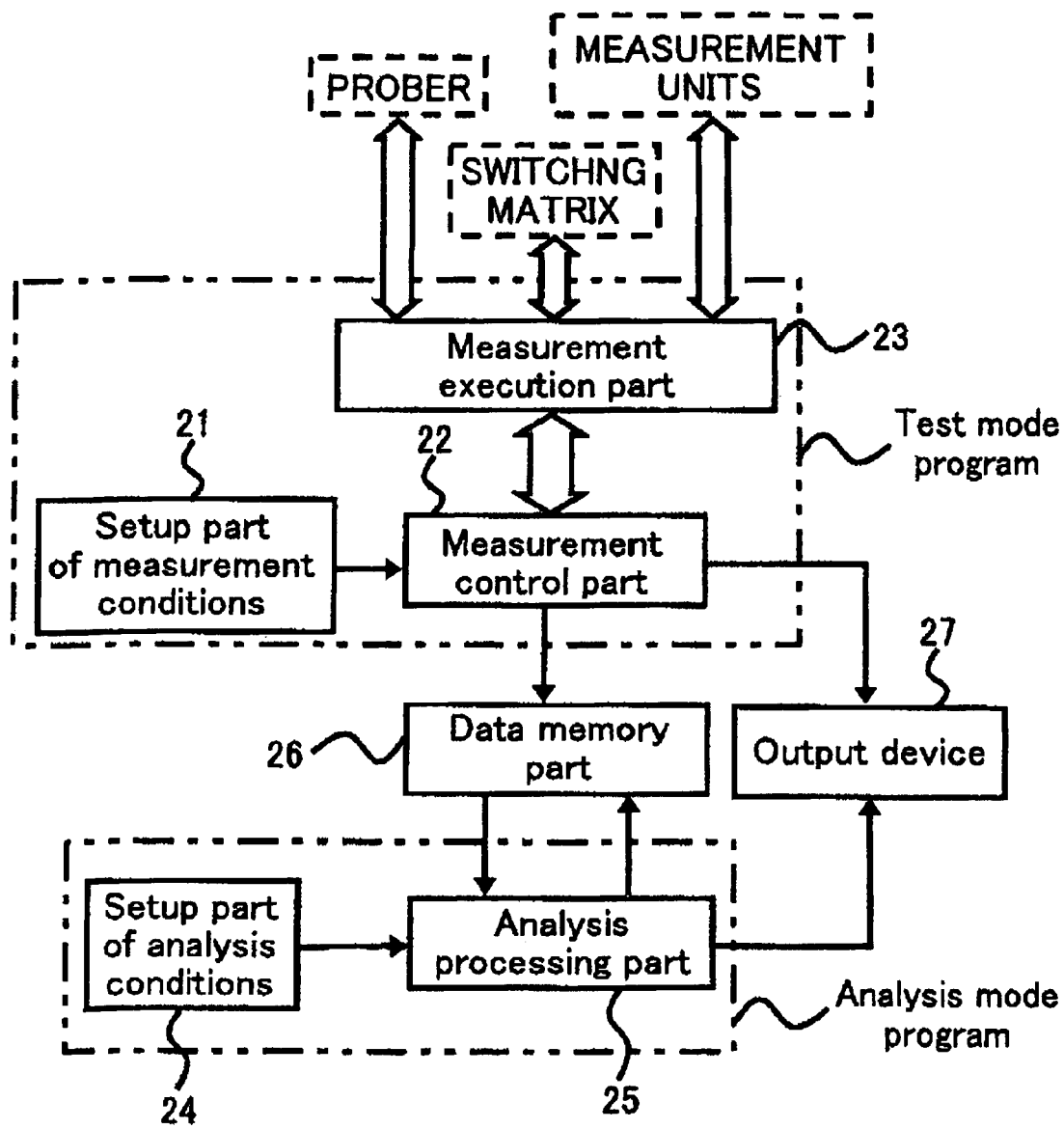

FIG. 8

| HP4156A | | | | | | | |
|---|---|---|---|---|---|---|---|
| File(F) Env(E) Help(H) | | | | | | | |
| CHANNEL | SWEEP | CONST | PGU | STR CHAN | STR SETUP | CONST | SETUP |

| *VARIABLE | VAR1 | | VAR2 | |
|---|---|---|---|---|
| UNIT | SMU1 | | SMU2 | |
| NAME | V1 | | V2 | |
| SWEEP MODE | SINGLE | ▼ | SINGLE | |
| LIN/LOG | LINEAR | ▼ | LINEAR | |
| START | 0 | V | 0 | V |
| STOP | 10 | V | 4 | V |
| STEP | 1 | V | 2 | V |
| No OF STEP | 11 | | 3 | |
| COMPLIANCE | 1m | I | 1m | I |
| POWER COMP | OFF | ▼ W | OFF | ▼ W |

| | VAR' |
|---|---|
| UNIT | Not Use |
| NAME | – |
| OFFSET | – |
| RATIO | – |
| COMPLIANCE | – – |
| POWER COMP | – ▼ W |

*SMU PULSE

| UNIT | Not Use |
|---|---|
| NAME | – |
| PERIOD | – s |
| WIDTH | – s |
| BASE | – – |

*TIMING

| HOLD TIME | 0.5 | s |
|---|---|---|
| DELAY TIME | 0.1 | s |

*SWEEP Status  STOP AT COMPLIANCE ▼

| Set Num From -100 To 100 | Comment | This is an initial parameter for 4156A s |
|---|---|---|

FIG. 10

| HP4156A | | | | | | | □|□|× |
|---|---|---|---|---|---|---|---|
| File(F) Env(E) Help(H) | | | | | | | |
| CHANNEL | SWEEP | CONST | PGU | STR CHAN | STR SETUP | CONST | SETUP |

*PULSE

| UNIT | PGU1 | | PGU2 | |
|---|---|---|---|---|
| NAME | PGU1 | | – | |
| PERIOD | 2 | s | – | s |
| WIDTH | 1 | s | – | s |
| DELAY TIME | 0 | s | – | s |
| PEAK VALUE | 1 | V | – | V |
| BASE VALUE | 1 | V | – | V |
| LEADING TIME | 10m | s | – | s |
| TRAILING TIME | 10m | s | – | s |
| IMPEDANCE | 0Ω | ▼ | – | ▼ |
| PULSE COUNT | FREE RUN | ▼ | – | ▼ |

*CONSTANT

| UNIT | PGU1 | | PGU2 | |
|---|---|---|---|---|
| NAME | – | | PGU2 | |
| SOURCE | – | V | 1 | V |

Select Data or Set Num From 1 To 655 | Comment | This is an initial parameter for 4156A s

FIG. 13

| HP4156A | | | | | | | | | | | — □ ✕ |
|---|---|---|---|---|---|---|---|---|---|---|
| File(F) Env(E) Help(H) | | | | | | | | | | |
| CHANNEL | SWEEP | CONST | PGU | STR CHAN | | STR SETUP | | CONST | SETUP | |
| *SWEEP CONSTANT | | | | | | | | | | |
| UNIT | SMU1 | | SMU2 | | SMU3 | | SMU4 | | SMU5 | |
| NAME | V1 | | V2 | | - | | - | | - | |
| MODE | V | | V | | - | | - | | ~ | |
| SOURCE | 3 | V | 3 | V | - | - | - | - | ~ | ~ |
| COMPLIANCE | 1m | 1 | 1m | 1 | - | - | - | - | - | - |
| UNIT | SMU6 | | VSU1 | | VSU2 | | PGU1 | | PGU2 | |
| NAME | - | | ~ | | - | | - | | PGU2 | |
| MODE | - | | - | | ~ | | - | | V | |
| SOURCE | - | - | - | - | ~ | - | - | - | 3 | V |
| COMPLIANCE | - | - | | | | | | | | |

| Set Num From -100 To 100 | Comment | This is an initial parameter for 4156A s |
|---|---|---|

FIG. 15

| HP4156A | | | | | | | | |
|---|---|---|---|---|---|---|---|---|
| File(F) Env(E) Help(H) | | | | | | | | |
| CHANNEL | SWEEP | CONST | PGU | STR CHAN | STR SETUP | CONST | DISP | SETUP |

*MEASUREMENT RANGE

| UNIT | NAME | RANGE | |
|---|---|---|---|
| SMU1 | V1 | AUTO ▼ | – ▼ |
| SMU2 | V2 | LIMITED ▼ | 10n ▼ |
| SMU3 | V3 | AUTO ▼ | – ▼ |
| SMU4 | V4 | AUTO ▼ | – ▼ |
| SMU5 | V5 | – ▼ | – ▼ |
| SMU6 | V6 | – ▼ | – ▼ |
| VMU1 | VMU1 | FIXED ▼ | 20 ▼ |
| VMU2 | VMU2 | AUTO ▼ | – ▼ |

ZERO CANCEL
ON ▼

*INTEG TIME

| MEDIUM ▼ | TIME | | NPLC |
|---|---|---|---|
| SHORT | 0.64m | s | 32m |
| MED | 20m | s | 1 |
| LONG | 0.32 | s | 6 |

*WAIT TIME  1  X(Default Wait Time)

Set Num From 2 To 100 | Comment | This is an initial parameter for 4156A s

FIG. 18

| HP4156A | | | | | | | | | _ □ × |
|---|---|---|---|---|---|---|---|---|---|
| File(F) Env(E) Help(H) | | | | | | | | | |
| CHANNEL | SAMPLING | CONST | PGU | STR CHAN | STR SETUP | CONST | DISP | SETUP | |

*SWEEP CONSTANT

| UNIT | SMU1 | | SMU2 | | SMU3 | | SMU4 | |
|---|---|---|---|---|---|---|---|---|
| NAME | - | | V2 | | V3 | | V4 | |
| MODE | - | | V | | V | | V | |
| SOURCE | - | - | 3 | V | 3 | V | 3 | V |
| COMPLIANCE | - | - | 0.01 | I | 1m | I | 1m | I |

| UNIT | SMU5 | | SMU6 | | VSU1 | | VSU2 | |
|---|---|---|---|---|---|---|---|---|
| NAME | - | | - | | - | | - | |
| MODE | - | | - | | - | | - | |
| SOURCE | - | - | - | - | - | - | - | - |
| COMPLIANCE | - | - | - | - | | | | |

| Set Num From -100 To 100 | Comment | This is an initial parameter for 4156A s |
|---|---|---|

FIG. 20

| | OUT1 | OUT2 | OUT3 | OUT4 | OUT5 | OUT6 | OU |
|---|---|---|---|---|---|---|---|
| SMU1 | O | - | - | - | - | - | - |
| SMU2 | - | O | - | - | - | - | - |
| SMU3 | - | - | - | - | - | - | - |
| SMU4 | - | - | - | - | - | - | - |
| CV1 ▼ | - | - | - | - | - | - | - |
| CV2 ▼ | - | - | - | - | - | - | - |

Comment: This is an initial parameter for E5250 s

Sequence a

Sequence b

Sequence c

FIG. 22

| | | | | | | | | | | |
|---|---|---|---|---|---|---|---|---|---|---|
| Setup for Sequence | | | | | | | | | | |
| File(F) Env(E) | | | | | | | | | | |
| MODE | S1 | S2 | S3 | S4 | S5 | ← 229 | | | | |
| *Stress Sequence | | | | | | | | | | |
| | Stress Type | Matrix File | Unit File | Data Name | SubNo | Disp | X | Y1 | Y2 | |
| List | Not Use ▼ | - ▼ | - | - | - ▼ | - ▼ | - ▼ | - ▼ | - ▼ | |
| | LIN/LOG | START | STOP | No of STEP | No per Samp | | ☐ Use Option | | | |
| View | - | - s | - s | - | - | | Set Up ← 227 | | | |
| *Measurement Sequence ← 228 | | | | | | | | | | |
| 222 | 223 | 224 | 225 | 226 | 227 | | | | | |

| Use | Mes Mode | Matrix File | Unit File | Data Name | SubNo | Disp | X | Y1 | Y2 |
|---|---|---|---|---|---|---|---|---|---|
| 1 | ○ | HP4156 ▼ | MtIV.spa ▼ | Test_IV.ipa | IV_01 | 0 ▼ | Clear ▼ | V1 ▼ | I1 ▼ | Not Use ▼ |
| 2 | ○ | HP4284 ▼ | MtCV.spa ▼ | Test_CV.cpa | CV_01 | 0 ▼ | Clear ▼ | V ▼ | Cp ▼ | Not Use ▼ |
| 3 | ○ | Str_HP4158 ▼ | MtIV.spa | - | - | - ▼ | - ▼ | - ▼ | - ▼ | - ▼ |
| 4 | ○ | HP4156 ▼ | MtIV.spa ▼ | Test_IV.ipa | IV_02 | 0 ▼ | Add01 ▼ | V1 ▼ | I1 ▼ | Not Use ▼ |
| 5 | ○ | HP4284 ▼ | MtCV.spa ▼ | Test_CV.cpa | CV_02 | 0 ▼ | Add02 ▼ | V ▼ | Cp ▼ | Not Use ▼ |

| Comment | This is an initial parameter for a sequence setup |
|---|---|

Set String or Double Click

Setup for Sequence
File(F) Env(E)

MODE S1 S2 S3 S4 S5

*Stress Sequence

| | Stress Type | Matrix File | Unit File | Data Name | SubNo | Disp | X | Y1 | Y2 |
|---|---|---|---|---|---|---|---|---|---|
| | Samp_HP4156 ▼ | 5250IV.spa ▼ | 4156SAMP | 4156StrSamp | 0 ▼ | Clear ▼ | Time ▼ | I1 ▼ | Not Use ▼ |

| List | LIN/LOG | START | STOP | No of STEP | No per Samp | ☐ Use Option |
|---|---|---|---|---|---|---|
| View | LINEAR | 0    s | 10   s | 5 | 11 | Set Up |

*Measurement Sequence

| | Use | Mes Mode | Matrix File | Unit File | Data Name | SubNo | Disp | X | Y1 | Y2 |
|---|---|---|---|---|---|---|---|---|---|---|
| 1 | O | HP4156 | 5250IV.spa ▼ | 4156VF.ipa | StrVF | 0 ▼ | Clear ▼ | V1 | I1 | IS |
| 2 | O | HP4156 | 5250IV.spa ▼ | 4156Vgd.ipa | StrVgd | 0 ▼ | Clear ▼ | V | ID | - |
| 3 | - | HP4156 | - ▼ | - | - | - ▼ | - ▼ | - | - | - |
| 4 | O | HP4284 | 5250CV.spa ▼ | 4284DCN.cpa | StrDCN | 0 ▼ | Clear ▼ | V | Cp | D |
| 5 | - | HP4156 | - ▼ | - | - | - ▼ | - ▼ | - | - | - |

Set String or Double Click | Comment | This is an initial parameter for a sequence setup

FIG. 25A

| No | USE | DIR NAME | MODE | |
|---|---|---|---|---|
| 1 | O | TR1 | S1 | ▼ |
| 2 | O | TR2 | S2 | ▼ |
| 3 | O | TR3 | S2 | ▼ |
| 4 | O | TR4 | S3 | ▼ |
| 5 | O | TR5 | S1 | ▼ |
| 6 | O | TR6 | S2 | ▼ |
| 7 | O | TR7 | S1 | ▼ |
| 8 | O | TR8 | S1 | ▼ |

Set up Die — File(F) Disp(D) Env(E) — MODE D1 | D2 | D3 | D4 | D5 — 254 253 251 252 — Comment

FIG. 25B

Set up Die — File(F) Disp(D) Env(E) — SubSite — MODE | D4 | D5

| No | USE | DIR NAME | MODE | |
|---|---|---|---|---|
| 1 | O | TR1 | S1 | ▼ |
| 2 | O | TR2 | S2 | ▼ |
| 3 | O | TR3 | S2 | ▼ |
| 4 | O | TR4 | S3 | ▼ |
| 5 | O | TR5 | S1 | ▼ |
| 6 | O | TR6 | S2 | ▼ |
| 7 | O | TR7 | S1 | ▼ |
| 8 | O | TR8 | S1 | ▼ |

Comment

FIG. 26A

| No | DIR NAME | X (um) | Y (um) | COMMENT | PARAMETER |
|----|----------|--------|--------|---------|-----------|
| 1  | TR1      | 0      | 0      | nMOS1   | Click     |
| 2  | TR2      | 100    | 0      | nMOS2   | Click     |
| 3  | TR3      | 200    | 0      | nMOS3   | Click     |
| 4  | TR4      | 0      | 100    | nMOS4   | Click     |
| 5  | TR5      | 100    | 100    | nMOS5   | Click     |
| 6  | TR6      | 200    | 100    | nMOS1   | Click     |
| 7  | TR7      | 0      | 200    | nMOS2   | Click     |
| 8  | TR8      | 100    | 200    | nMOS3   | Click     |

261 — DIR NAME
262 — X (um)
263 — Y (um)
264 — COMMENT
265 — PARAMETER

Set up SubSite

OK

Set String | Comment | This is an initial parameter for a subsite

FIG. 26B

Set Site Parameter

| Temp    | 24  | C    |
|---------|-----|------|
| Area    | 1   | cm2  |
| L       | 0.2 | um   |
| W       | 100 | um   |
| OxThick | 50  | A    |

OK  CANCEL

FIG. 32

| No | USE | DIR NAME | MODE | |
|---|---|---|---|---|
| 1 | ○ | TR1 | S1 | ▼ |
| 2 | ○ | TR2 | S2 | ▼ |
| 3 | ○ | TR3 | S2 | ▼ |
| 4 | ○ | TR4 | S3 | ▼ |
| 5 | ○ | TR5 | S1 | ▼ |
| 6 | ○ | TR6 | S2 | ▼ |
| 7 | ○ | TR7 | S1 | ▼ |
| 8 | ○ | TR8 | S1 | ▼ |

Set up Die

File(F)  Disp(D)  Env(E)

MODE D1 | D2 | D3 | D4 | D5

Comment

FIG. 33

Setup for Sequence

File(F)  Env(E)

| MODE S1 | S2 | S3 | S4 | S5 |
|---|---|---|---|---|

*Stress Sequence

| Stress Type | Matrix File | Unit File | Data Name | SubNo | Disp | X | Y1 | Y2 |
|---|---|---|---|---|---|---|---|---|
| ▼ Not Use | - ▼ | - | - | - ▼ | - ▼ | - ▼ | - ▼ | - ▼ |

| List | LIN/LOG | START | STOP | No of STEP | No per Samp | ☐ Use Option |
|---|---|---|---|---|---|---|
| View | - ▼ | - s | - s | - | - | Set Up |

*Measurement Sequence

| Use | Mes Mode | Matrix File | Unit File | Data Name | SubNo | Disp | X | Y1 | Y2 |
|---|---|---|---|---|---|---|---|---|---|
| 1 | ⊘ HP4156 ▼ | MtIV.spa | Test_IV.ipa | IV_01 | 0 ▼ | Clear ▼ | V1 ▼ | I1 ▼ | Not Use ▼ |
| 2 | ⊘ HP4284 ▼ | MtCV.spa | Test_CV.cpa | CV_01 | 0 ▼ | Clear ▼ | V ▼ | Cp ▼ | Not Use ▼ |
| 3 | O Str_HP4156 ▼ | MtStr.spa | Test_IV.ipa | - | - ▼ | - ▼ | - ▼ | - ▼ | - ▼ |
| 4 | O HP4156 ▼ | MtIV.spa | Test_IV.ipa | IV_02 | 0 ▼ | Add01 ▼ | V1 ▼ | Not Use ▼ | I1 ▼ |
| 5 | O HP4284 ▼ | MtCV.spa | Test_CV.cpa | CV_02 | 0 ▼ | Add02 ▼ | V ▼ | Not Use ▼ | Cp ▼ |

Set String or Double Click | Comment | This is an initial parameter for a sequence setup

FIG. 34

Setup for Sequence

File(F)  Env(E)

| MODE S1 | S2 | S3 | S4 | S5 |

*Stress Sequence

| Stress Type | Matrix File | Unit File | Data Name | SubNo | Disp | X | Y1 | Y2 |
|---|---|---|---|---|---|---|---|---|
| Samp_HP4156 ▼ | 5250IV.spa | 4156SAMP | 4156StrSamp | 0 ▼ | Clear ▼ | Time ▼ | I1 | Not Use ▼ |

| List | LIN/LOG | START | | STOP | | No of STEP | No per Samp | Use Option | No | Add | Sum |
|---|---|---|---|---|---|---|---|---|---|---|---|
| View | LINEAR | 0 | s | 30 | s | 10 | 4 | | 1 | 10 | 10 s |
| | | | | | | | | Set Up | | | |

*Measurement Sequence

| | Use | Mes Mode | Matrix File | Unit File | Data Name | SubNo | Disp | X | Y1 | Y2 |
|---|---|---|---|---|---|---|---|---|---|---|
| 1 | O | HP4156 ▼ | MtIV.spa | Test_IV1.ipa | IV_01 | 0 ▼ | Clear ▼ | V1 ▼ | I1 ▼ | Not Use ▼ |
| 2 | O | HP4156 ▼ | MtIV.spa | Test_IV2.ipa | IV_02 | 0 ▼ | Clear ▼ | V1 ▼ | I2 ▼ | Not Use ▼ |
| 3 | – | HP4156 ▼ | MtIV.spa | Test_IV3.ipa | IV_03 | 0 ▼ | Clear ▼ | V1 ▼ | I1 ▼ | I2 ▼ |
| 4 | O | HP4284 ▼ | MtCV.spa | Test_CV1.cps | CV_01 | 0 ▼ | Clear ▼ | V ▼ | Cp ▼ | D ▼ |
| 5 | – | HP4284 ▼ | MtCV.spa | Test_CV2.cps | CV_02 | 0 ▼ | Clear ▼ | V ▼ | Cp ▼ | Not Use ▼ |

Comment | This is an initial parameter for a sequence setup

FIG. 37A

| | 371 | 372 | 373 | 374 | 375 |

| USER | | Lot No | | Parameter File | MODE | | |
|---|---|---|---|---|---|---|---|
| Taro | ▼ | TAR001 | ▼ | Test_T | C1 | ▼ | LOAD |
| Taro | ▼ | TAR002 | ▼ | Test_T | C2 | ▼ | LOAD |
| Taro | ▼ | TAR003 | ▼ | Test_T | C3 | ▼ | LOAD |
| Jiro | ▼ | JIR003 | ▼ | Test_T | C1 | ▼ | LOAD |

FIG. 37B

| USER | | Lot No | | Parameter File | MODE | | |
|---|---|---|---|---|---|---|---|
| Taro | ▼ | TAR001 | ▼ | Test_T | C1 | ▼ | LOAD |
| Taro | ▼ | TAR002 | ▼ | Test_T | C2 | ▼ | LOAD |
| Taro | ▼ | TAR003 | ▼ | Test_T | C3 | ▼ | LOAD |

FIG. 37C

| USER | | Lot No | | Parameter File | MODE | | |
|---|---|---|---|---|---|---|---|
| Taro | ▼ | TAR001 | ▼ | Test_T | C1 | ▼ | LOAD |

USER INTERFACE FOR SEMICONDUCTOR EVALUATION DEVICE

TECHNICAL FIELD OF THE INVENTION

The present invention is related to the semiconductor evaluation device, which evaluates characteristics of semiconductor devices formed on a wafer, and is particularly concerned with a user interface technology and a control system for controlling measuring tool measuring semiconductor devices for the semiconductor evaluation device.

BACKGROUND OF THE INVENTION

In the semiconductor manufacturing process, in order to evaluate electrical characteristics of semiconductor devices on a manufactured wafer, TEG (Test Element Group) patterns, which are an aggregate of elements to be evaluated, are formed on the wafer, and then, the characteristics of the TEG patterns are evaluated.

As shown in FIG. 1B, on a wafer W taken from cassette C, which was brought from semiconductor production lines, one or more dies (chips) D are formed. In each die D, one or more sub-sites S are included. An aggregate pattern on the plural sub-sites S located on the die D is the TEG patterns. In each sub-site, a semiconductor device is formed. Here a FET is illustrated as an example. Pad P is formed at each terminal of this FET. And the characteristics test is performed by contacting a probe (probe electrode) with the pad P.

Namely, under computer control, the semiconductor evaluation device takes a wafer W out from the carried-in cassette C and sets it to a chucking stage, and contact the probe with any of the pads P of semiconductor devices in the selected sub-site S to measure this wafer. The measurement is conducted for the many sub-sites in a sequence, such as; for example, after measuring IV/CV, applying stresses, and then again conducting measurement of IV/CV. The data obtained from the measurement are operated in a computer to out put results of the measurement.

For characteristics tests like above, first of all setting up conditions of the measuring instruments is required. For this purpose, in the semiconductor evaluation device, a user interface for setting measurement conditions is provided.

However, conventional user interfaces for setting measuring conditions were inconvenience in use, because they were uniformly designed to a specific object to be set, such as measurement instruments, without considering its unique characteristic.

Moreover, when multiple measurement sequences are executed, such as the case that different measurement sequences are performed for each sub-site, a setting interface is prepared for each of the measurement sequences, or individual measurement is performed by applying each of different measuring software programs. Therefore, whenever the setting interface differs, recognizing its contents is burdensome and conducting evaluation for each of the different measuring software is required.

Further, when results of the measurement of transistors and the like, which have different element size, for example, when analyzing the evaluation results per unit size in an element, analysis is performed two or more times for every transistor, as it is necessary to input the element size into evaluation formula.

In this regard, the present invention aims at solving the problems of how to improve a user interface in semiconductor evaluation devices.

More specifically, the problem of the present invention is to offer a user interface for systematically setting up the necessary measurement conditions for conducting characteristics evaluation of semiconductor devices, and to improve the operationality of a user interface.

Furthermore, the present invention has the subject to offer a user interface for systematically setting up the analysis conditions for outputting the evaluation results based on the data measured according to the setup measurement conditions, and to improve its operationality.

SUMMARY OF THE INVENTION

The present invention is a user interface of the semiconductor evaluation device, which will provide at the user interface of the semiconductor evaluation devise evaluating the characteristics of the semiconductor elements on the wafer a means, on which a setting window is displayed in order to conduct the setting of the measurement/analysis conditions to each setup object having a hierarchical relation, a means on which a main setting window is displayed to manage the above-mentioned setting window, a means to save at a file the measurement conditions set up in the abovementioned setting window and a measure to load the measurement conditions, which were set up at No. 1 setting window to No. 1 setting object and saved at a file to the second setting window, which is located at the higher rank than No. 1 setting window as abovementioned and which will have the characteristics that the No. 2 setting window as abovementioned will set up selectively to a user the measurement conditions, which were loaded at the abovementioned second setting window.

As the setting object, which has a hierarchical relation cassette, wafer, die, measurement sequence and devices such as measurement unit are enumerated. In the setting window as abovementioned, therefore, cassette setting window, wafer setting window, die setting window, measurement sequence setting window, measuring device setting window and switching matrix setting window are provided.

As to the case of the abovementioned main setting window, it is desirable to make it save at a file the measurement conditions set up in the above-mentioned setting window and in this case, it is rather desirable that at least one of the cassette setting window, wafer setting window, die setting window and measuring sequence setting window will be the abovementioned setting window.

Furthermore, it is desired that the abovementioned measuring sequence setup window to be constructed, so that the measurement mode and parameter to the present measurement mode could be set up independently.

This invention is realized as a program to materialize the user interface of the semiconductor evaluation device evaluating the characteristics of the semiconductor elements on the wafer and as a recording medium for recording this program. To be concrete, the abovementioned program has the following functions, namely; the function to display the setting window in order to set up measurement conditions for each setting object having a hierarchical relation, the function to display the main setting window to manage the abovementioned setting window, the function to save at a file the measurement conditions, which were set up at the abovementioned setting window and the function to load the measurement condition setup at No. 1 setting window to No. 1 setting object, which were saved at a file, into No. 2 setting window to No. 2 setting object located at higher rank than the abovementioned No. 1 setting object then to make a user to set the loaded measurement conditions alternatively.

Moreover, present invention is a measurement condition setup method in the semiconductor evaluation device, which evaluates characteristics of the semiconductor elements on the wafer and a measurement condition setup method in the semiconductor evaluation device to display No. 1 setting window to No. 1 setting object, to make a user to expedite set up the prescribed measurement conditions, to save at a file the measurement conditions set up by the abovementioned user at the abovementioned No. 1 setting window, to load and display the saved measurement conditions as mentioned above from No. 2 setting window to the No. 2 setting object located at higher rank than the abovementioned No. 1 setting object and which has a characteristics to demand a user to provide the selective setup.

In the same time, present invention is the user interface of the semiconductor evaluation device, which is characterized that the means as hereinafter enumerated are provided in the user interface of the semiconductor evaluation device evaluating the characteristics of the semiconductor elements on the wafer, namely the means to display the object showing the setup object, which has the hierarchical relation complying with the abovementioned hierarchical relation, the means to display the setting window to comply with the abovementioned selected object in the case that any one of the abovementioned object was chosen by a user and the means to analyze measured data obtained from certain measurement device in compliance with the conditions to perform the analysis, which was set up at the abovementioned setup window.

In addition to, in the program realizing the control system of the semiconductor evaluation device, which evaluates the characteristics of the semiconductor elements on the wafer, present invention having abovementioned program has the setup function to conduct the measurement condition setup to each setting object, which has the hierarchical relation, and has the measurement executing function to control the measurement device, which conducts the measurement to the abovementioned semiconductor elements, and the abovementioned program is a program to realize control system of the semiconductor evaluation device, which has the characteristics that the abovementioned measurement execution function and the abovementioned measurement control function are composed by each independent program.

And, this invention provides in the semiconductor evaluation device, which evaluates the characteristics of the semiconductor elements on the specific wafer in the cassette, No. 1 mode (full automatic probing mode), which conducts the measurement to each of the plural wafer contained in the abovementioned cassette, which is the object of measurement, No. 2 mode (semi automatic probing mode), which conducts the measurement to one of the abovementioned wafer and No. 3 mode (manual probing mode), which conducts the measurement to the specific semiconductor elements on the abovementioned wafer, and this semiconductor evaluation device is a device, which has the characteristics that the device is composed, so that each mode could be switched fully selective. These selective switches of the mode could be the combination of No. 1 mode and No. 3 mode or No. 2 mode and No. 3 mode.

Further, in this specification the means do not only mean the physical means, but the case that the function switch is provided by the means to be realized by using the software (program) is included. And the function, which one means does have is can be realized by the physical means of more than two and the function, which provided by two or more means can also be realized by one physical means.

In this regard, this invention is materialized also as the program which makes a computer realize a predetermined function, or a memory medium which recorded the program. Here, for example, in the recording media the memory as RAM or ROM is included besides hard disc (HD), DVD-RAM, flexible disc (FD), CD-ROM and others. And in the computer so called micro-computer and others, which conduct the prescribed treatment in way that so called central processing unit such as CPU or MPU will interpret the program, are included.

BRIEF DESCRIPTION OF THE DRAWINGS

FIG. 2 is a block diagram, which indicates functional structure of the control system in the semiconductor evaluation device related with one embodiment of the present invention.

FIG. 8 is a diagram showing the setting window of IV measuring unit.

FIG. 10 is a diagram showing the setting window of IV measuring unit.

FIG. 13 is a diagram showing the measuring unit setting window.

FIG. 15 is a diagram showing the setting window of IV measuring unit.

FIG. 18 is a diagram showing the setting window of IV measuring unit in the sampling mode.

FIG. 20 is a diagram showing the switching matrix setting window.

FIG. 22 is a diagram showing one example of the measurement sequence setting window.

FIG. 23 is a diagram showing one example of the measurement sequence setting window in order to set up at sequence C.

FIG. 25 is a diagram showing one example of the die setting window.

FIGS. 26A–B are diagrams showing one example of the sub-site setting window.

FIG. 32 is a diagram showing one example of the die setting window at the measurement execution mode.

FIG. 33 is a diagram showing one example of the sequence setup window at the measurement execution mode.

FIG. 34 is a diagram showing one example of the sequence setup window at the measurement execution mode.

FIGS. 37A–C are diagrams showing one example of the data selecting window.

DETAILED DESCRIPTION OF THE PREFERRED EMBODIMENTS

Hereinafter, the embodiments of the present invention are explained, referred to the figures.

(Construction of Hardware)

Figure 1A:
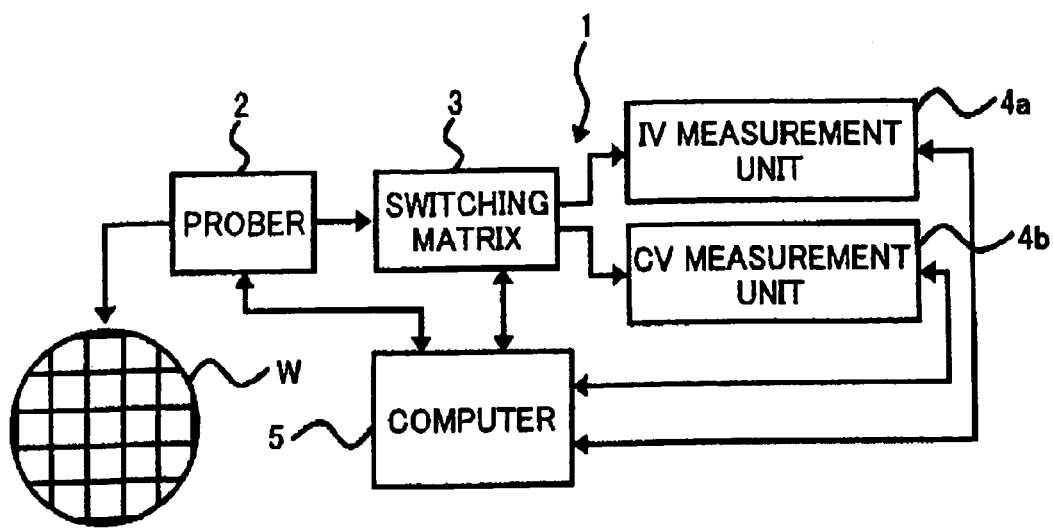
FIGS. 1A and 1B are one example of hardware composition of the semiconductor evaluation device related with one embodiment of the present invention.
Figure 1B:
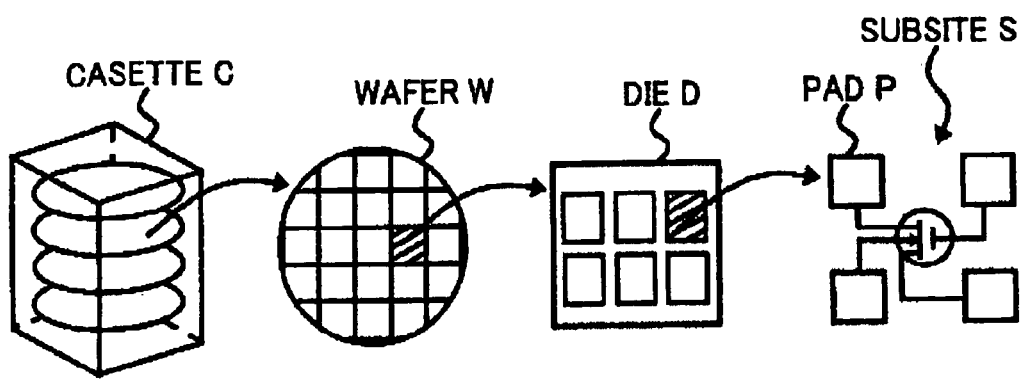

FIG. 1 shows one example of the construction of hardware in a semiconductor evaluation device related with one of the embodiment of the present invention. As shown in FIG. 1, semiconductor evaluation device 1 comprises prober 2, switching matrix 3, measuring unit 4, and computer 5 for controlling over these hardware devices. Prober 2 is categorized as manual type, semi-automatic type, and full-automatic type, where in this embodiment the full-automatic prober is applied to. Prober 2 takes out one of wafers W out of carried-in cassette C and sets the wafer on a chucking stage, and then, has it contacted with pads P of the semiconductor device in the prescribed sub-site S. These probes are electrically connected with either one of the two measuring units 4a and 4b through switching matrix 3. Switching matrix 3 is provided for switching its connecting destination to either of IV measuring unit 4a or CV measuring unit 4b. In this embodiment, "HP-4156" manufactured by Agilent Technologies, Inc. is used as IV measuring unit 4a, "HP-4282" manufactured by the same is used as CV measuring unit 4b, and "HP-E5250" of the same manufacturer is used as switching matrix 3. Computer 5 controls these prober 2, switching matrix 3, and measuring unit 4 and automatically measures and evaluates the electrical characteristics of the semiconductor devices on the wafer W to display on the screen or to printout to a printer the evaluation results.

(Function Composition of Software)

FIG. 2 is the block diagram showing the composition of the control system function, which is accomplished by a system program executed by computer 5. This control system provides a test mode for setting up parameters designating measurement conditions and for executing the measurement according to the above setting and a data analyzing mode for performing an analysis based on the data obtained from the measurement. In addition, for the actual device, the test mode is divided into measurement parameter setting mode and measurement execution mode.

As shown in FIG. 2, the program for executing the test mode includes measuring parameter setting part 21, measurement control part 22, and measurement implementation part 23. And the program for executing the data analysis mode includes analysis condition setting part 24 and analysis treatment part 25.

Namely, the measurement condition setting part 21 is provided for setting various measurement conditions for measuring units. The measurement condition setting part 21 is realized typically as user interface that enables users to set measurement parameters on the computer screen of a computer by using a keyboard, a mouse, and the like.

The measurement control part 22 receives the measurement conditions set at the measurement condition setting part 21, responds to a transferring demand of the measurement conditions, which is sent from measurement execution part 23, and transfers the measurement conditions to the measurement execution part 23 successively. When the conditions required for measurements are received, measurement execution part 23 measures a prober 2, a switching matrix 3, and measuring units 4 by controlling them directly, and then, transfers the results of the measurements (measured data) to the measurement control part 22.

The measurement control part 22 receives measurement data sent from the measurement execution part 23, memorizes them in data memory parts 26, such as a hard disk, and also outputs them to output unit 27, such as a display and a printer and the like. The analysis condition setting part 24 is provided for setting various analysis conditions for performing analysis of the measured data, which is implemented as the user interface described above. The analysis processing part 25 readouts the measurement data currently recorded on the memory part 23 for analysis according to the analysis parameters set by the analysis conditions. The analysis treatment part 25 outputs the results of the analysis (analyzed data) to the data memorizing part 26, together with outputting them to the output unit 27.

In the present embodiment, the program for realizing the measurement control part 22 and the program for realizing the measurement realization part 23 are constituted independently, and these programs are executed by way of mutual exchanges of information. The independently constituted programs as mentioned here are used as extensive meanings including, for example, each program module in a program realizing the prescribed functions as a whole, and a program and the like realizing an agent/a manager (client/server). When these programs are executed in a computer, the mutual communications are implemented by, for example, DDE, Active X and others, which are supplied with the operating system. When these programs are executed on multiple computers through the network, mutual communications are conducted with a network protocol such as TCP or UDP and others. As the result, even when the construction of the control system was changed, it could flexibly adjust by altering the mutual communication form between these programs.

In addition, each of the programs has no limitation to a specific programming language. Thus, the program for realizing the measurement execution part 2 is preferably described with an interpreter base program language such as BASIC language, which is easy to edit, and the other programs are preferably described with a compiler-base program language such as C language, which is not so easy to edit but to be able to realize high speed performance. Accordingly, it could flexibly accommodate design changes upon satisfying the requirements of performing the control system in high speed.

[Measurement Parameter Setting Mode]

Figure 3:
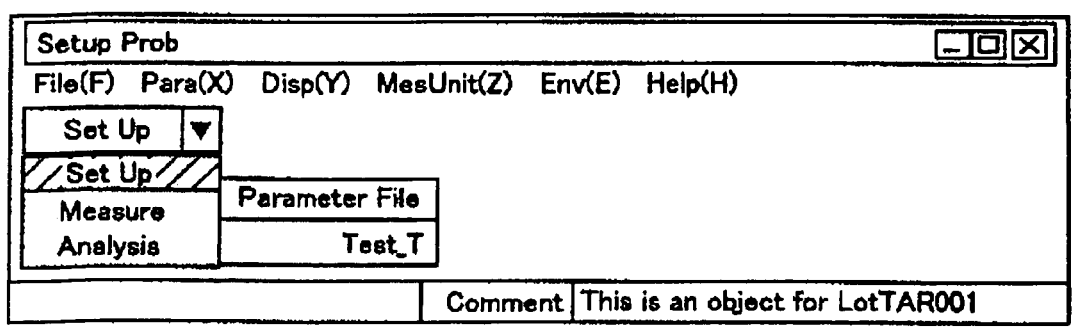
FIG. 3 is a diagram showing the main setting window that is displayed on a computer screen.

FIG. 3 is a diagram showing the main setting window. In this main setting window, a user is able to choose with its pull down menu either one of the 3 modes namely: measurement parameter setting mode (Set Up), measurement execution mode (Measure), and data analysis mode (Analysis). When a user selects either of these modes, the main setting window is changed to the display contents for the selected mode, as illustrated in FIGS. 4A–C.

Figure 5:
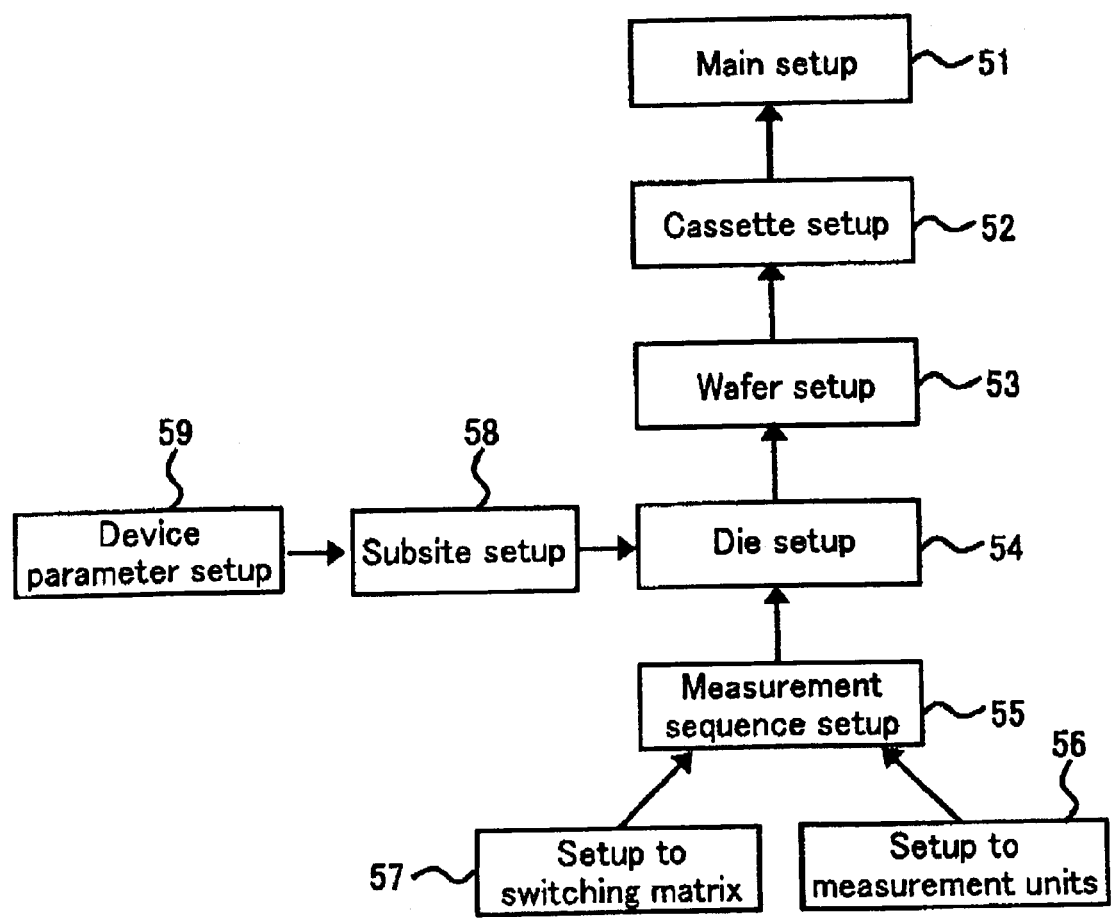
FIG. 5 is an explanation diagram showing the setup mode of the measurement parameter.

FIG. 5 is a figure for explaining the measurement parameter setup mode. In this measurement parameter setup mode, there are main setting 51, cassette setting 52, wafer setting 53, die setting 54, measurement sequence setting 55, setting 56 for each measuring unit, setting 57 for a switching matrix, sub-site setting 58, and element parameter setting 59. Each of these settings is arranged in a hierarchical manner as illustrated, and parameters set in lower level can be referred to when setting in higher level. In the settings from the main setting 51 to the measurement sequence setting 55 and element parameter setting 59, their setting items depend on the type of prober 2. On the other hand, in the setting 56 for the measuring unit and setting 57 for the switching matrix, their setting items depend on hardware composition of the semiconductor evaluation device 1. In the present embodiment, therefore, the settings for the IV measuring unit 4a and setting for the CV measuring unit 4b are conducted at the setting 56 for the measuring unit. The sub-site setting 58 can be arranged between the die setting 54 and the measurement sequence setting 55.

Figure 4A:
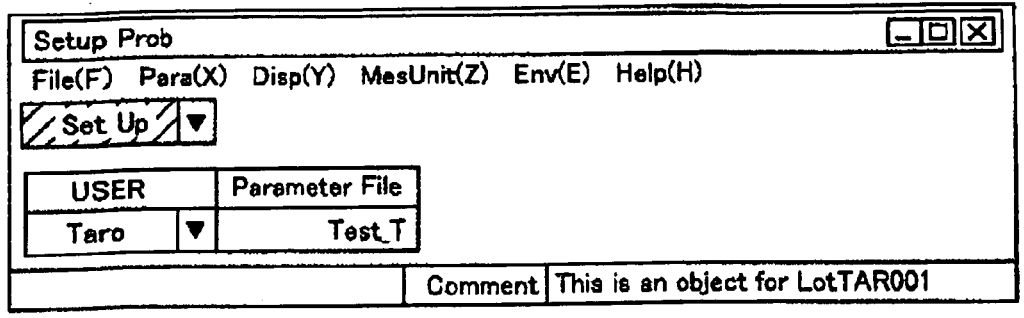
FIGS. 4A–C are diagrams showing the main setting windows.
Figure 4B:
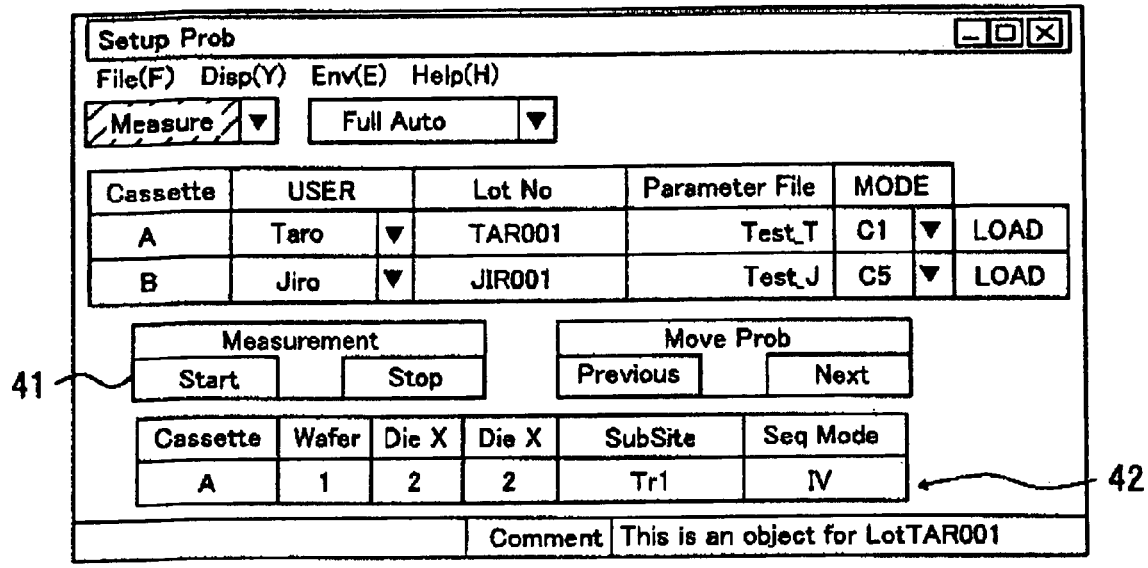
Figure 4C:
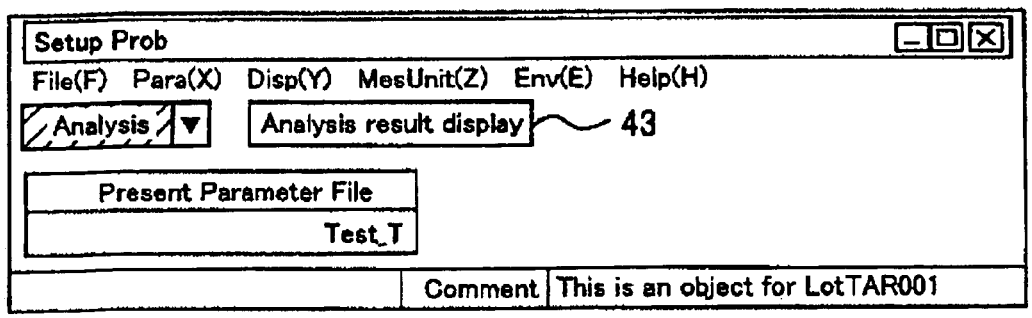

First, in the main setting window as shown in FIG. 4A, a user chooses own user name, which was registered in advance for the purpose to utilize present control system. The user name is memorized beforehand with the user's standard directory by, for example, "Env(ironment)" command in the menu bar.

Figure 6:
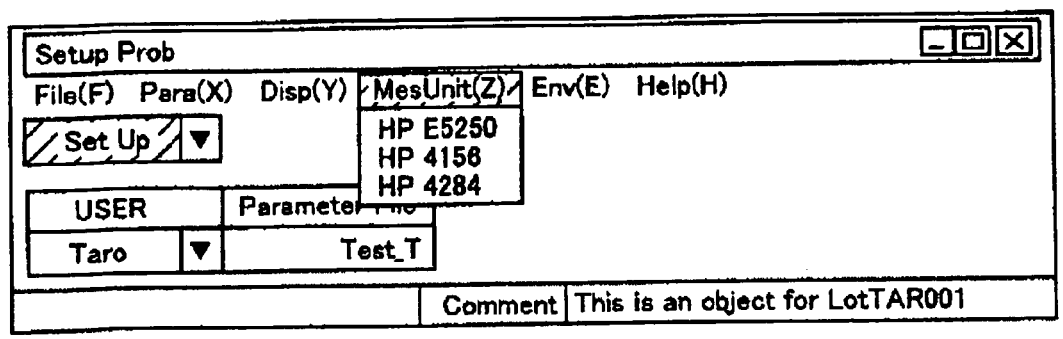
FIG. 6 is a diagram showing the main setting window.
Figure 7:
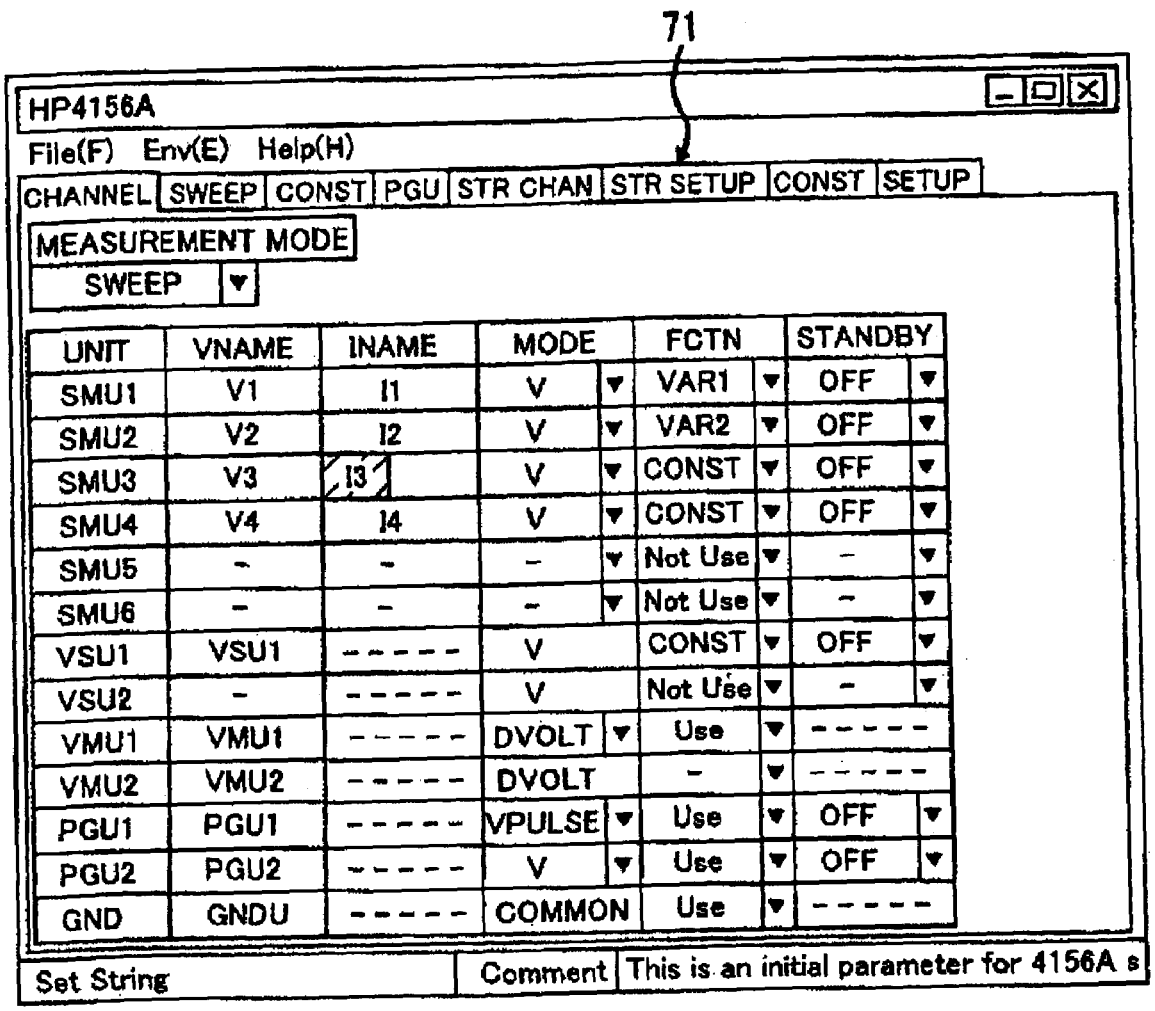
FIG. 7 is a diagram showing the setting window of IV measuring unit.
Figure 9:
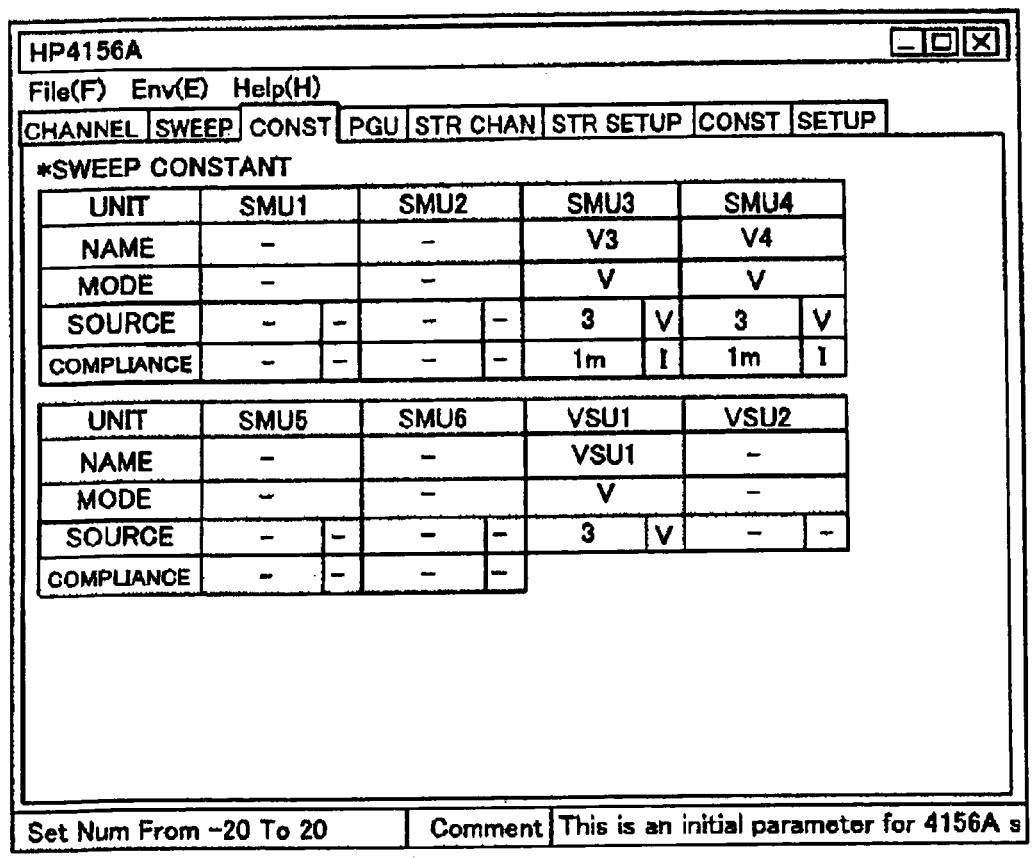
FIG. 9 is a diagram showing the setting window of IV measuring unit.

In the next, the user chooses "Mes(surement)Unit" command in order to conduct setup 56 to the measuring unit (FIG. 6). For example, if the user chooses "HP-4156" (IV measuring unit), the measuring unit setting window is displayed as shown in FIG. 7. As sown in FIG. 7, the setting items in this window are divided into tabs 71, and parameters to be set at each tab 71 are arranged in a matrix fashion, so that users can see the whole picture of them. When the user chooses either one of the tabs 71, the display contents are accordingly switched to respective display contents in the window. In the IV measuring unit 4a, three setting modes (MEASUREMENT MODE): sweep mode (I-V measuring mode), stress mode (constant current and constant voltage applying mode), and sampling mode (I-T or V-T measuring mode), are provided. Here, the notion I, V, and T indicate current, voltage and time, respectively.

FIGS. 7–10 show the sweep mode setting window. For example, when FCTN is set for SMU, VSU, VMU, and PGU in CHANNEL tab, respectively, as shown in FIG. 7, the related items among items in SWEEP tab of FIG. 8, CONST tab of FIG. 9, and PGU tab of FIG. 10 are displayed in a condition to be able to set.

Figure 11:
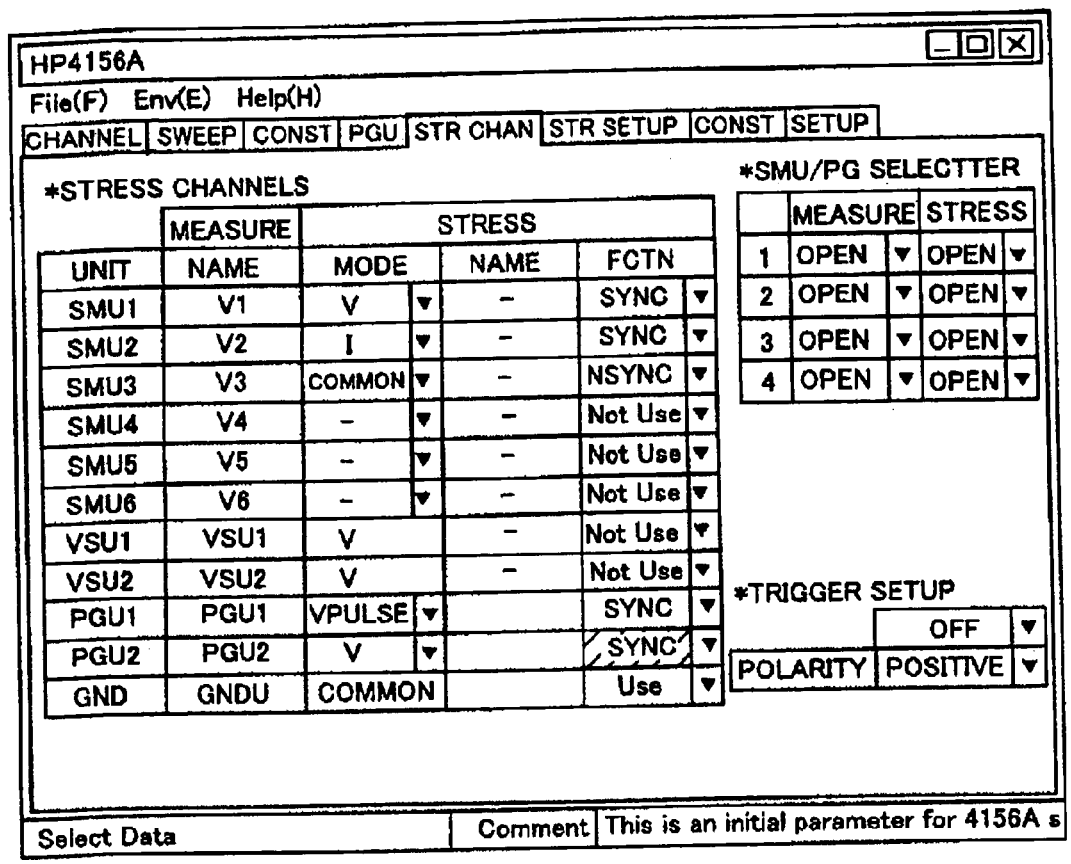
FIG. 11 is a diagram showing the setting window of the measuring unit, which is displayed on the computer screen.
Figure 12:
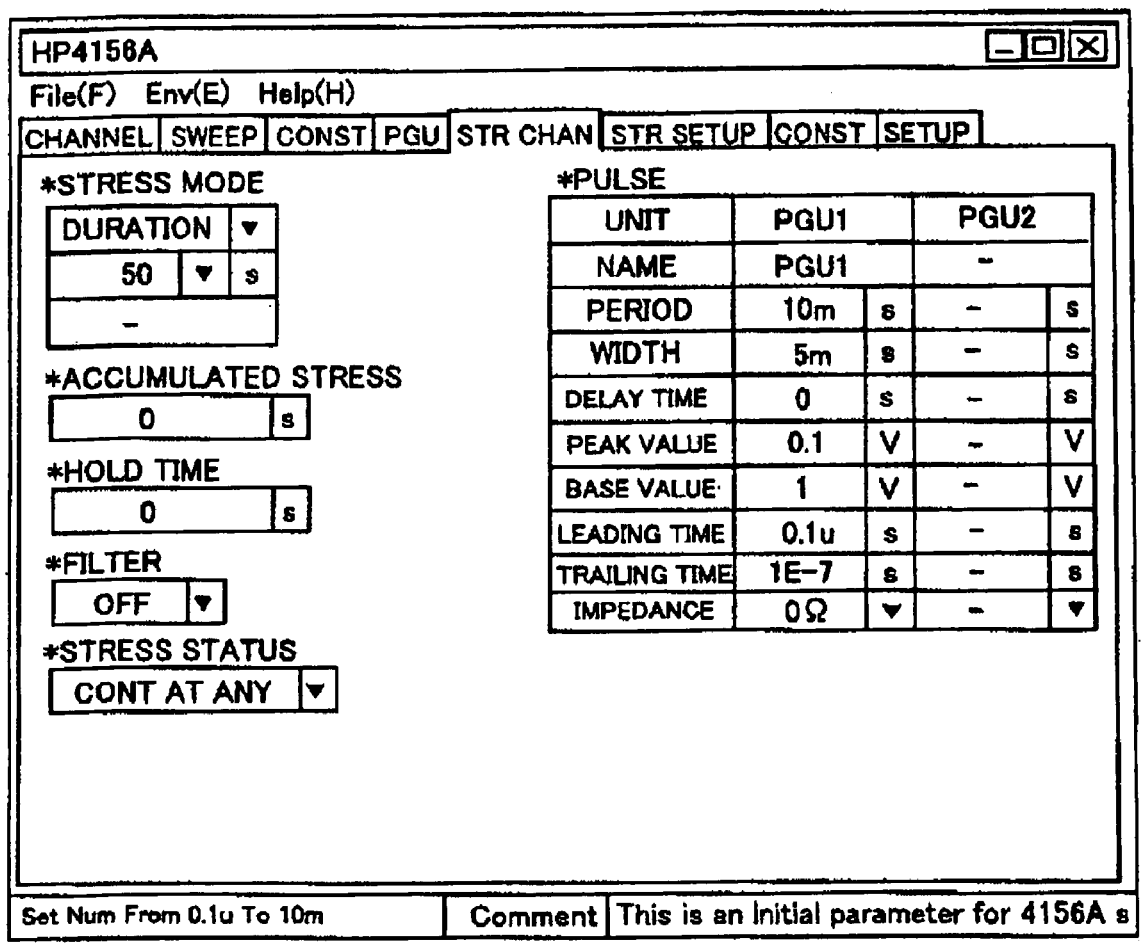
FIG. 12 is a diagram showing the measuring unit setting window.
Figure 14:
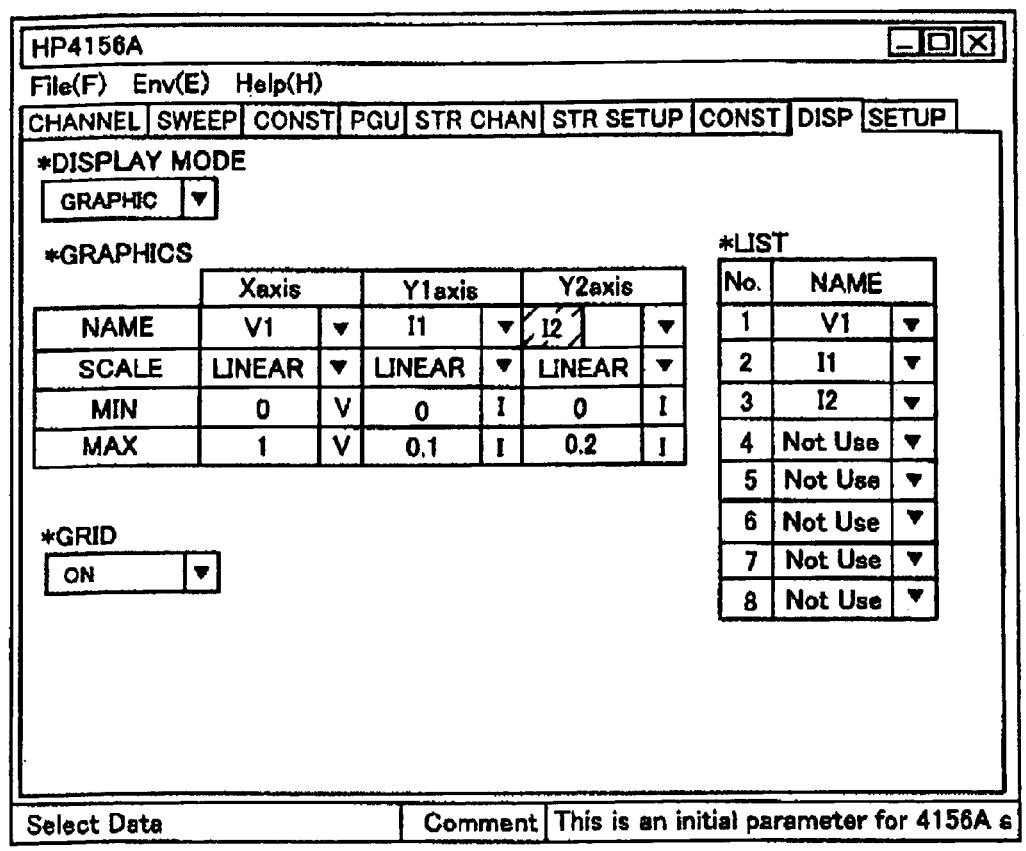
FIG. 14 is a diagram showing the setting window of IV measuring unit.

FIGS. 11–13 show the Stress mode setting window. Likewise in this case, the related items among items in STRSETUP tab of FIG. 12 and CONST tab of FIG. 13 are displayed in a condition to be able to set, when setting variously in STRCHAN tab. Moreover, the screen display form of the measurement unit (HP 4156A) itself can be displayed in DISP tab shown in FIG. 14. And the measurement range of SMU and VMU and the data average time at the time of measurement can be set in SETUP tab as shown in FIG. 15.

Figure 16:
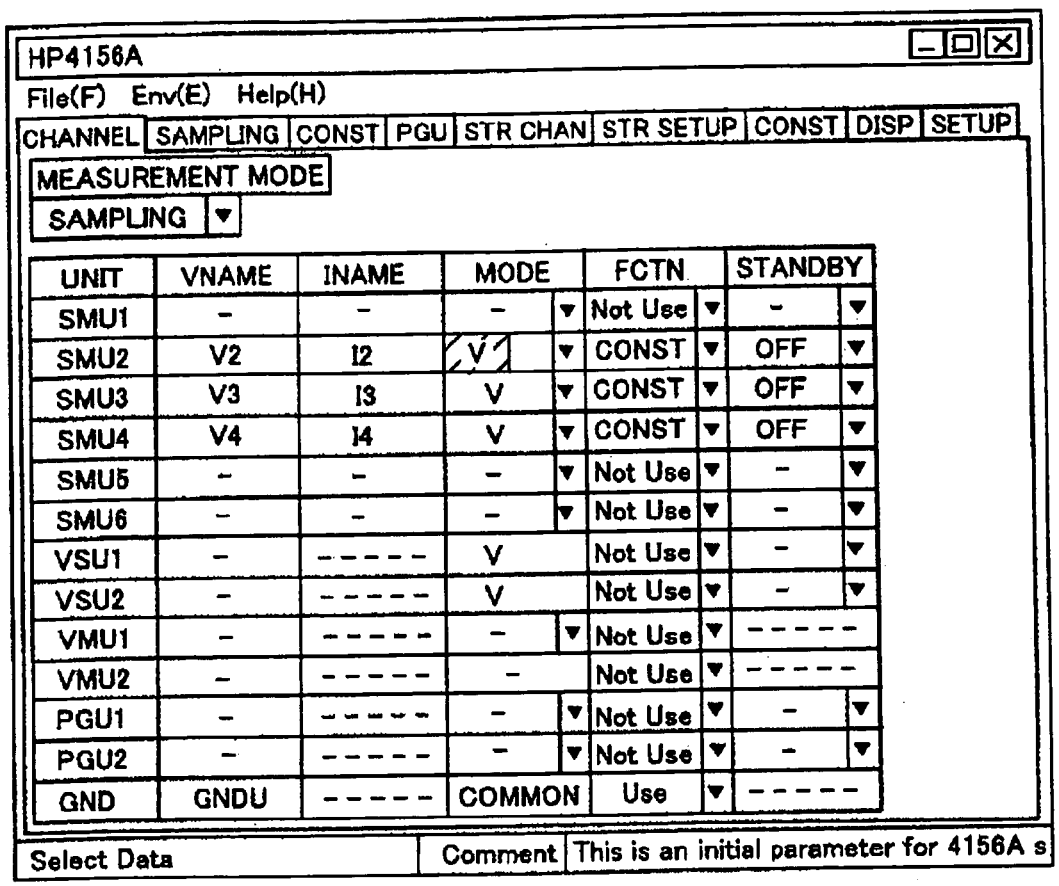
FIG. 16 is a diagram showing the setting window of IV measuring unit in the sampling mode.
Figure 17:
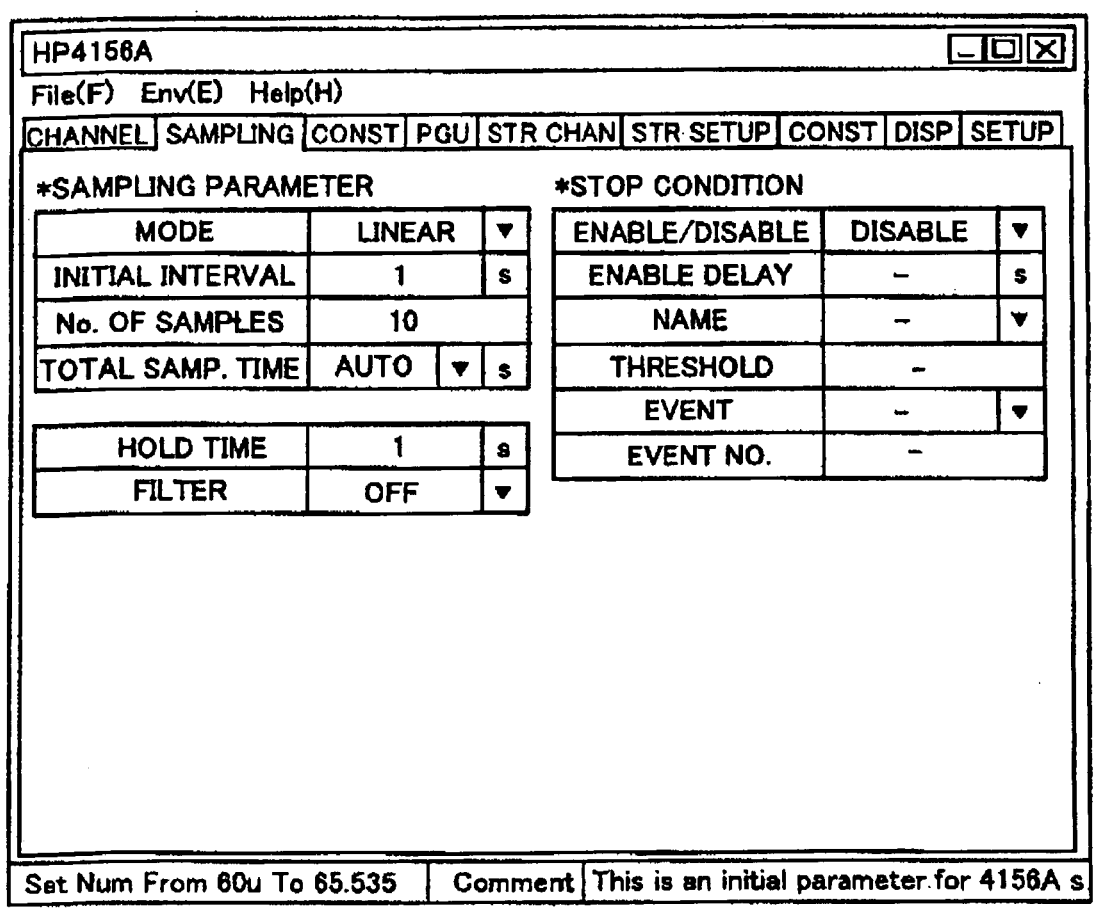
FIG. 17 is a diagram showing the setting window of IV measuring unit in the sampling mode.

FIGS. 16–18 show the Sampling mode setting window. That is, when measurement mode is switched to Sampling, the tab itself and the displayed contents therein are also changed. In this Sampling as well, the related items in the tab as shown in FIGS. 17 and 18 are also displayed in a condition to be able to set according to the settings in CHANNEL tab of FIG. 16. After setting the prescribed setting parameters for the IV measuring unit 4a, the user designates a file name to save the setting contents with a "File" command at this window. For the above, the setting for the IV measuring unit 4a is completed.

Figure 19A:
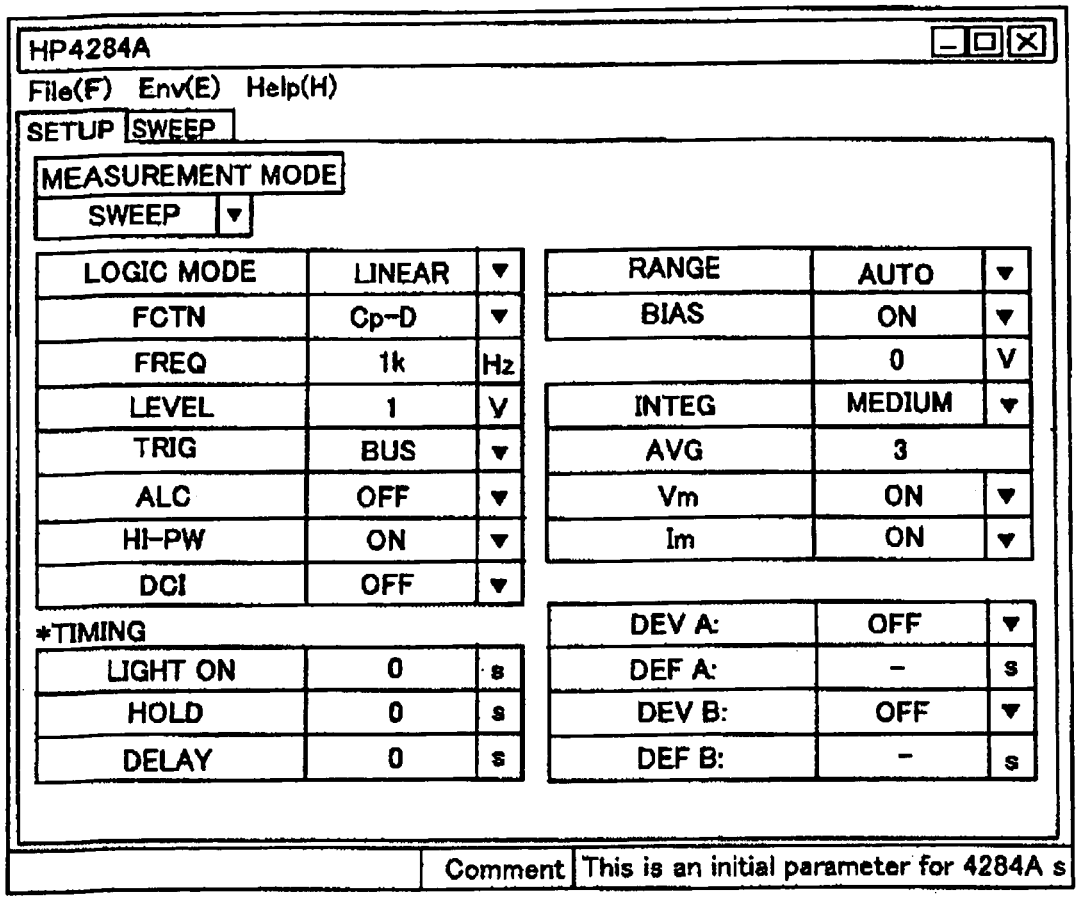
FIGS. 19A 19B are diagrams showing the CV measuring unit setting window.
Figure 19B:
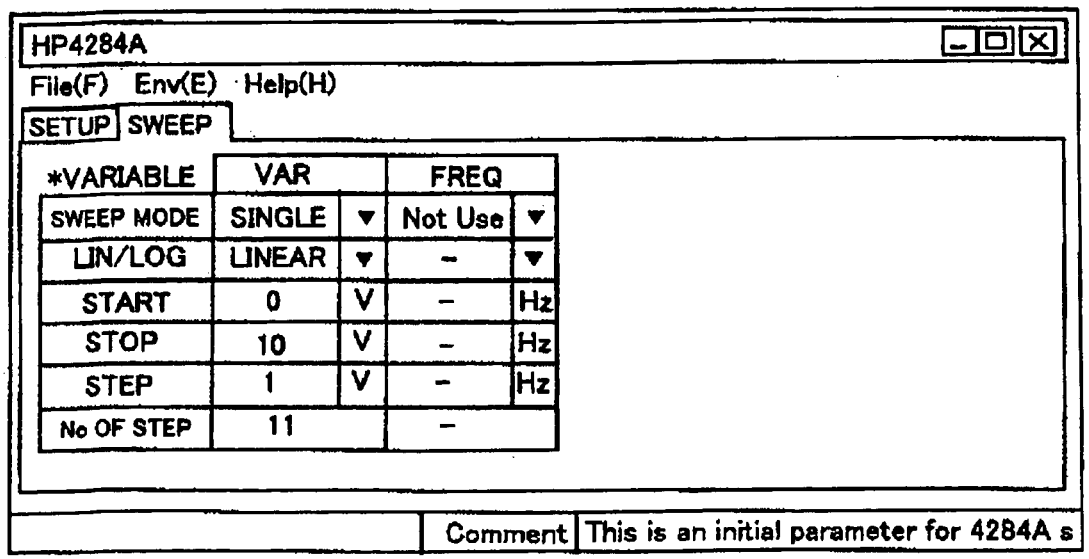

Back to the main setting window as shown in FIG. 6, when the user chooses "HP-4284" (CV measuring unit), a window as shown in FIG. 19 is displayed. After setting the prescribed parameters for this window, the user designates as well a file name with the "File" command to save the setting contents. For the above, the setting for the CV measuring unit 4b is completed.

Likewise, back to the main setting window as shown in FIG. 6, when the user chooses "HP-E5250" (switching matrix), a window as shown in FIG. 20 is displayed. As shown in FIG. 20, the user can specify about which prober and which unit are connected with check boxes arranged in a matrix manner. After setting the prescribed parameters, the user also designates a file name with the "File" command to save the setting contents. The saved contents will be utilized in the measurement sequence setting 55. For the above, the setting for the switching matrix 3 is completed.

Figure 21A:
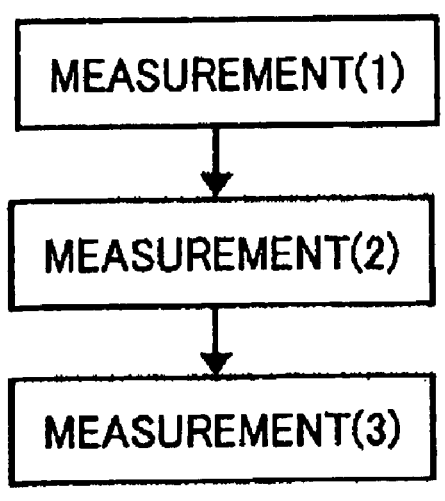
FIGS. 21A–C is an explanation diagram for the measurement sequence.
Figure 21B:
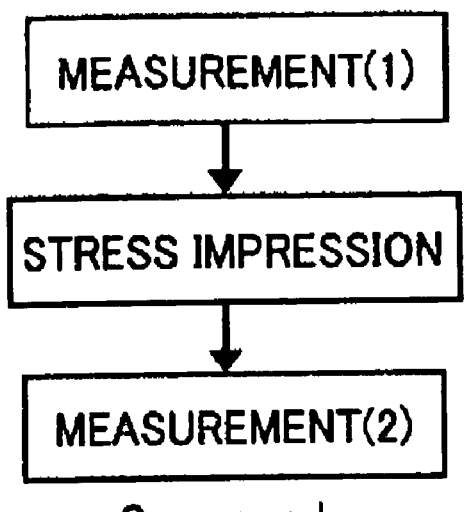
Figure 21C:
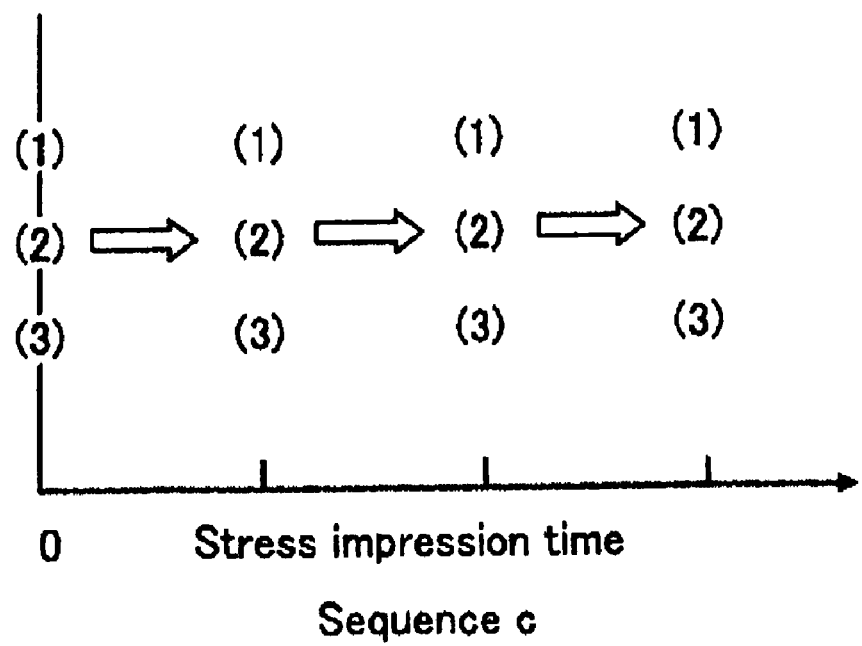

Next, the setting sequence 55 will be explained. The measurement sequence is typically divided with three types (Sequences a–c) as shown in FIG. 21. Namely, the Sequence A in FIG. 21A is to perform deferent measurements (1)–(3) in order. The Sequence B as shown in FIG. 21B is to perform measurement (1) and to perform measurements (2) (or (3)) after applying stress. In this case, it is common that the measurement is performed under the same measurement conditions between before and after stress application to display in comparison these measurement results. The Sequence C as shown in FIG. 21C is to conduct measurements (1)–(3) several times while applying stresses in a specified interval. Namely, FIG. 21 shows an example of which a combination of measurements (1)–(3) and the stress application is repeated three times. Here, the stress application at the Sequence C can be either a sampling measurement method, which measures during application, or another measurement method.

FIG. 22 is a window for setting the measurement sequence. When the user chooses "Sequence" at the "Disp(lay)" command in the main setting window, the measurement sequence setting window is displayed. FIG. 22 indicates the situation where the measurement conditions for the Sequence B as shown in FIG. 21 are set. Namely, the user sets Stress Mode 221 to Not Use, Mes Type 222 to HP4156 (IV measurement), HP4284 (CV measurement), Str_HP4156 (Stress application), HP4156 and HP4284 in order, so that the sequences conducting IV and CV measurements are executed again. In addition, if the stress application at Mes Type 222 is not selected, then the setting for the Sequence A results.

Moreover, the user sets file names in Matrix File 223 and Unit File 224. Here, the file names designated are the ones that are stored in the setting 57 (of which setting screen are shown in FIG. 20) and the setting 56 (of which setting screen is shown in FIG. 7 or 19). For example, where "IV_01" for Data Name and "1" for SubNo are set, the measurement file name becomes "IV_01_00001." The last two digits refer to SubNo and the three digits before them refer to the number of Stress application when Stress is set in Stress Type 221.

Further, the user sets the display form for graph displaying on the screen of the measured data to Disp 227 and graph axis 228. Disp 227 is for selecting the display form on the screen to select Clear that depicts after display deletion and to select Add that depicts on the prescribed sequence numbers in an overlapping manner. For example, No. 4, by set Add01, has the setting to display as a graph by overlapping the results measured at No. 1 with the results measured at the present time (No. 4). This is displayed as a graph such as FIG. 41B latterly. Similarly, at No. 5, by set Add02, a graph is displayed by overlapping the results measured at No. 2 with the results measured at the present time (No. 5).

By preparing setting items like these, the settings to display changes in the IV and CV characteristics before and after stress application can be performed easily. The graph axis 228 is selectable arbitrarily the items for each axis by the pull-down menu method, where Y2 means the second axis Y used for a superposition display.

On the other hand, FIG. 23 is the sequence setting window for setting the sequence C. Namely, the user sets Stress Type 221 to Stress or Sampling in the window shown in FIG. 23. In this embodiment, the user can select the device name too, and Sampling of HP4156 is selected in this figure. As to the Use 231, each of No. 1, No. 2, and No. 4 (marked as circle in the figure) is set to ON. As a result, these three are used among the sequence numbers, to which the measurement conditions are already input. For the above, after the completion of the IV measurement, for which two HP4156 are used, and the CV measurement, for which HP4284 is used, the measurement that applies stress and again applies stress repeatedly after the same three measurements are completed is executed.

Figure 24A:
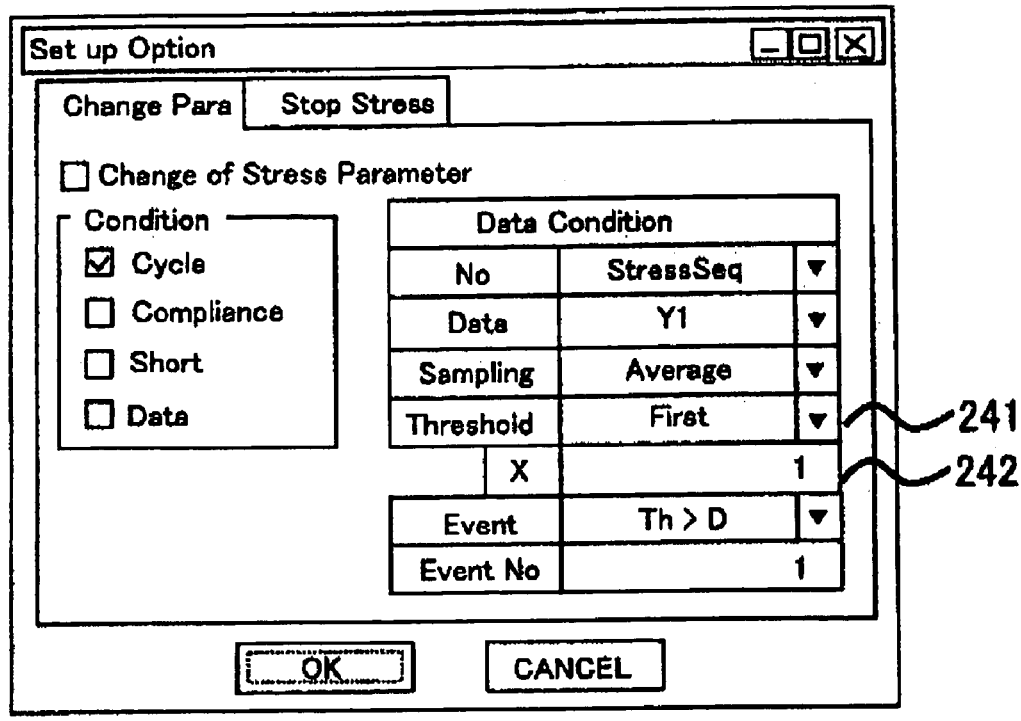
FIGS. 24A–B are diagrams showing one example of the window related with the measurement sequence setting window.

Further, when "Set Up" is clicked, FIG. 24A is displayed. In FIG. 24A, the method for changing stress application conditions is set, and in FIG. 24B, the conditions for discontinuing the loop of the stress application are set.

When "Change of Stress Parameta" of FIG. 24A is checked, alterations in the conditions for stress application become effective. At "Condition" the conditions for changes in application conditions are selected. The stress application conditions are changed respectively for "Cycle" at every stress application, "Compliance" when the compliance restriction occurs, "Short" when that the measurement data are insufficient, and "Data" when the conditions of "Data Condition" shown at the right-hand side are satisfied. As a table for change of stress application conditions several methods can be utilized either one such as a table where "Unit File" is enumerated, designation by file name having ordinality, use of a setup panel for change in the conditions.

Figure 24B:
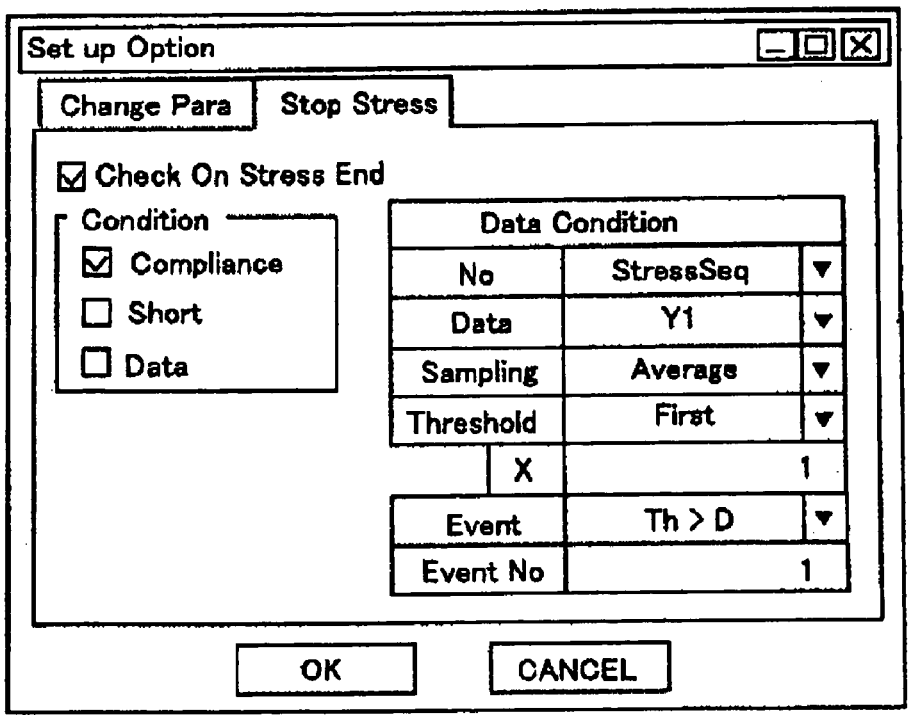

As shown in FIG. 24B, if the check box of "Check On Stress End" is checked, the stress application loop can be discontinued when the setting conditions are satisfied. In this case, the conditions for discontinuing the application loop are selected for "Condition." The application loop is discontinued when the compliance restriction occurs for "Compliance," when the measurement data are insufficient for "Short," and when the conditions of "Data Condition" shown at the right-hand are satisfied for "Data," respectively.

In the "Data Condition", "No" indicates that the stress application data or the number of the measurement data (indicated as the reference numeral 232 in FIG. 23) are designated. Namely, the stress application data when "Stress Seq" is selected and the measurement data of "Measurement Sequence" when a measurement number is designated can be selected as reference data. For "Data," the data items among the measurement data for determining the conditions are selected. And for "Sampling," data extraction conditions among the data items are set up. Namely, when "Average," "Max," "Min," "First," "Last," and "Number" are designated, the average value, the maximum value, the minimum value, the first data, the last data, and the value of the designated number in order are extracted respectively as the reference data. For "Threshold," the conditions of a threshold value are set in items 241 and 242. In item 241, how to extract threshold data by use of the reference data extracted by the settings above at each stress application is set. Namely, when "Average", "Max", "Min", "First", "Last" and "Number" are designated, the average value, the maximum value, the minimum value, the first data, the last data, and the value of the designated number in order are extracted respectively. For these extracted value, the value calculated according to item 242 is set as a threshold value. In this example, an example where the extracted data multiplied by one is shown. In "Event," the reference data value extracted from the measurement data just before the designation and the relation with the threshold, as conditions for causing an event, are set. In this example, an event is designed to occur when reference value (D) becomes smaller than threshold value (Th). In "Event No," the number of events that terminates the stress application loop is set.

At the measurement sequence setting window as shown in the FIGS. 22 and 23, a user can set up different five measurement sequences by selecting tab 229. And as above-mentioned, if Use 231 is set up, it can be used with the specific measurement conditions. As a result, the way of use that only the measurement conditions necessary for measuring are selectively used can be applied.

The measurement sequence setup window is arranged to enable settings for each of Mes Type 222 and Unit File 224 independently. Moreover, by sharing the program main body to two individual components comprising the measurement executing part in FIG. 2 and the other parts, supplement and correction of the measurement algorism (IV measurement, CV measurement, stress application treatment etc,) can be performed easily. A part of the contents of the setting file readout by the system program is indicated as follows.

| Mode | Com | DefExt |
|---|---|---|
| HP4156 | IV | ipa |
| HP4282 | CV | cpa |
| Str-HP4156 | STR | ipa |

In this setting file, a string of characters (in this example, HP 4156, HP 4284, or Str-HP 4156) to be displayed at Mes Type 222 as shown in FIG. 22 for Mode, a string of characters to be transferred from the second program (measurement control part 22 in FIG. 2) to the first program (measurement enforcement part 23 in FIG. 2) for Com, and the extension of the file to be read in at Unit File 224 for DefExt are designated. Only by editing the contents of the text file read-in, a user can easily add and change the measurement mode at the sequence setting. Moreover, when describing the switching matrix and the IV, CV setting screen into files with texts for easy constructing and each altering, changes of the measurement devices are accommodated by merely changing the files described with the texts, without altering the second program itself. In addition, the setting changes above can be done through a setting display of a specific editor.

The first program is necessary to be changed its program for each measurement device. For this purpose, it is recommended to design the first program with a programming language which is easy to change such as BASIC language. For example, when to change the prober in FIG. 29 explained hereinafter, it is accomplished by changing the part relating to "Order for transfer to prober" when changing the prober and by changing the parts relating to "IV measurement treatment," "CV measurement treatment," and "Stress application processing" when changing the measurement device and its measurement algorithm.

Meanwhile, with the "Env"(ironment) command of the menu bar in the measurement sequence setting window as shown in FIGS. 22 23, with or without Matrix File setting and Unit File setting is selected. When the absence of Matrix File setup is selected, it means the setting without the switching matrix, and when the absence of Unit File setup is selected, it means that the setup measurement conditions set at the present window is applied, but not the unit file set for each of the measuring device stored in the setting window.

Further, with the "File" command of the menu bar, of the files recording all the measurement conditions, only the measurement conditions defined by parameters about the measurement sequence setup 55 can be read in, while the measurement conditions about the cassette setup 52—the die setup 54 are not. Accordingly, storing (outputting to a file) the measurement conditions set as the above is implemented at the main setting window.

FIG. 25 shows a window for explaining the die setup 54. A user, at first in order to conduct the sub-site setting, chooses Sub-site with the "Disp"(lay) command as in FIG. 25B to display a sub-site setting window as shown in FIG. 26A. Here, the user sets an arbitrary DIR NAME 261, displacement coordinates from the standard point X262 and Y263, and COMMENT 264.

Next, the user chooses PARAMETA 265 to display various parameter setup windows as shown in FIG. 25B. For those windows, the user chooses various parameters such as W, L, and the thickness of a gate oxide film and the like and then, the OK button to return to the window shown in FIG. 25A. After completing all the settings for this window, the user chooses the O.K. button to return to the die setting window shown in FIG. 25A. In the die setting window, the user can add and delete and the like the rows (corresponding with either of the contents created in FIG. 26A).

For example, the user can delete any row by moving the mouse cursor to the line to be deleted in the window and selecting the "delete" command in the pop-up window displayed with clicking the right button of the mouse. And by selecting the "Add" command in the pop-up window, the user can add new line. When a new line is added, DIR NAME 261, which was set at the sub-site setting window, is shown in the DIR NAME 251. MODE 252 is selected among MODEs S1–S5 (tag 229) set in the sub-site setting window. Even in this die setting window, the user is able to set five different die conditions by choosing tab 253. Moreover, by setting Use, only a specific measurement condition can be used.

For the above, the usage that the measurement conditions are previously all defined and, afterwards, are selectively used a measurement condition necessary for each measurement. In the "File" command, the measurement condition, of the files recording all the measurement conditions, relating to the die setting can be readout, while the measurement conditions relating to the cassette setting 52-wafer setting 53, or in addition the measurement conditions about the measurement sequence setting 55 cannot. To store (output to a file) the measurement conditions at the die setting is done in the main setting window.

For this way, as location information for the sub-site and DIR NAME, for example, are mutually linked so that the relating referent can be selected, one can measure and analyze data without recognizing in error, even when the location information of the sub-site is to change. For instance, if the temperature of wafer W for the measurement varies in a large scale like from 0° C. to 200° C., it is necessary to correct the location information of the sub-site because of their heat expansion. In this case, what if you manage the sub-site with the absolute location information as the ordinal setting, the same sub-site could be erroneously recognized as another one due to displacement. In the present embodiment, the measurement conditions are managed at the related referent level, the measurement and data analysis are performed without an erroneous recognition even when the displacement of the location information occurs.

Figure 41A:
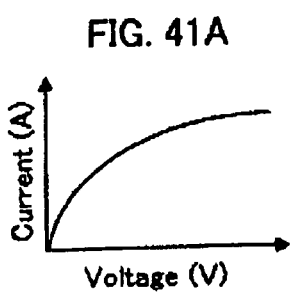
FIGS. 41A–J are diagrams showing the graph display.
Figure 41B:
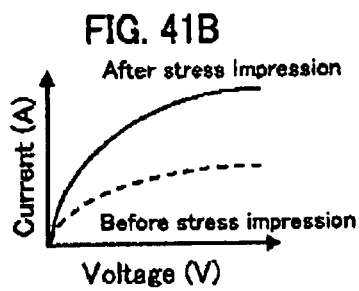

As shown in FIGS. 26A and B, one can directly look up the element information at each sub-site without taking memos, by linked the related information for each sub-site. In addition, the data attributing to the sub-site information as shown in FIG. 41D can be displayed. Where the value L (FIG. 26B) for TR1, TR2, and TR3 in FIG. 25A are "1", "2," and "3," the value L is indicated along the horizontal axis and the results of each measurement are shown at the vertical axis so that changes of the measurement results to the associated L can be easily displayed. Since only one resulting point for each measurement data should be extracted for the display, a threshold and the like may be arranged for the extraction.

Figure 27A:
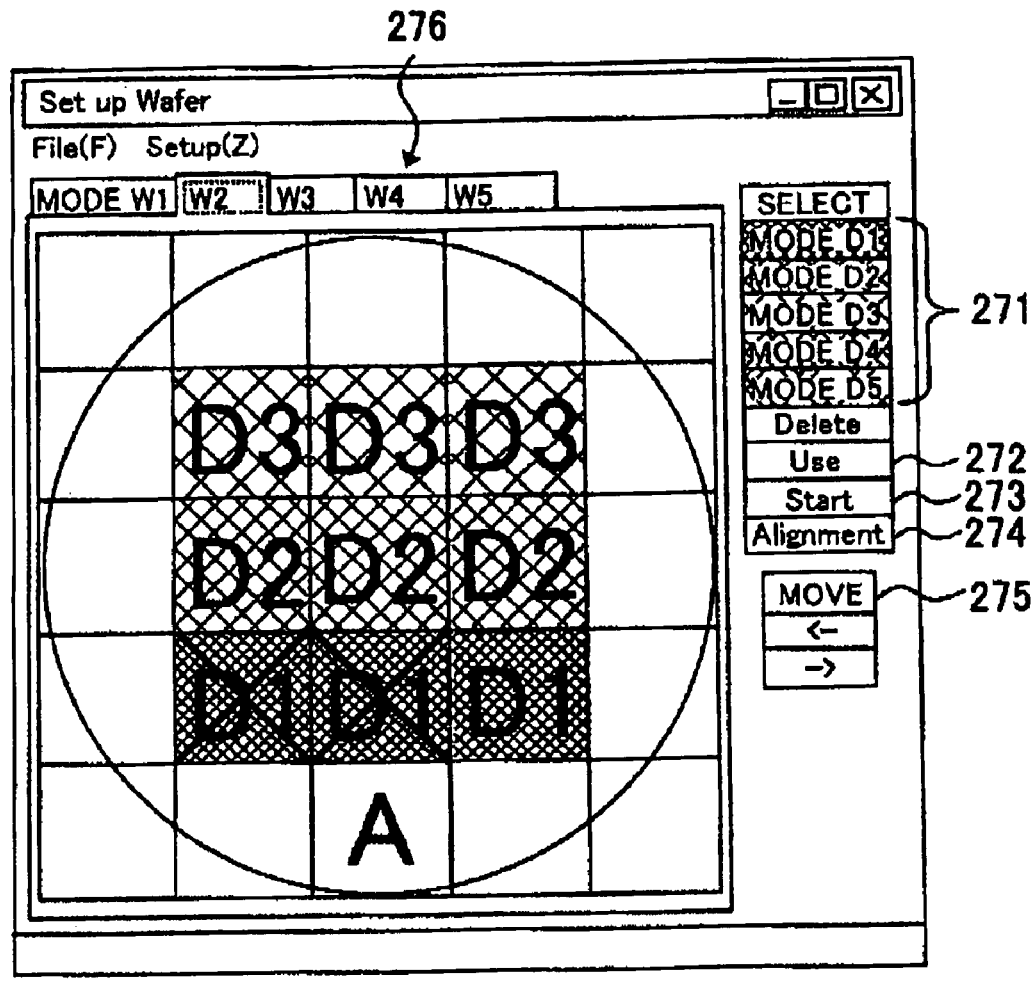
FIGS. 27A–B are diagrams showing one example of the wafer setting window.
Figure 27B:
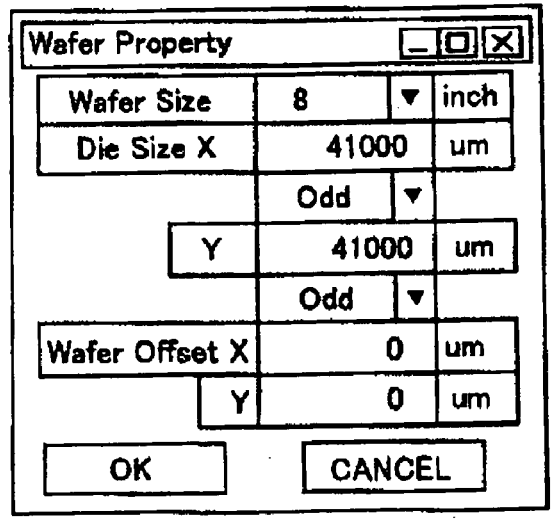

FIG. 27 shows the window for explanation of the wafer setting. First, a user chooses a "setting" command to display the wafer property setting window shown in FIG. 27B and to perform necessary setup of wafer size etc. Next, the user sequentially chooses per each die MODEs D1–D5, which were set by die setting 54. This is conducted by designating MODE 271 and the subject die (block area in the screen). After selecting START 273, the user can set starting position of the measurement by selecting the die. Moreover, after selecting USE 272, the user can set up the actual measurement point by selecting the die. If the user chooses Alignment 274, the location of the standard point (alignment position) can be set when the prober moves.

MOVE 275 is provided for the purpose to designate the transfer direction of the stage at the time of measurement. From this wafer setting window, a use is able to set up conditions for five different wafers by selecting tab 276. Moreover, with the "file" command, the measurement conditions about a wafer setting can be loaded from the files recording all the measurement conditions. Further, storing (output to a file) the measurement conditions in the wafer setting is performed in the main setting window.

Figure 28A:
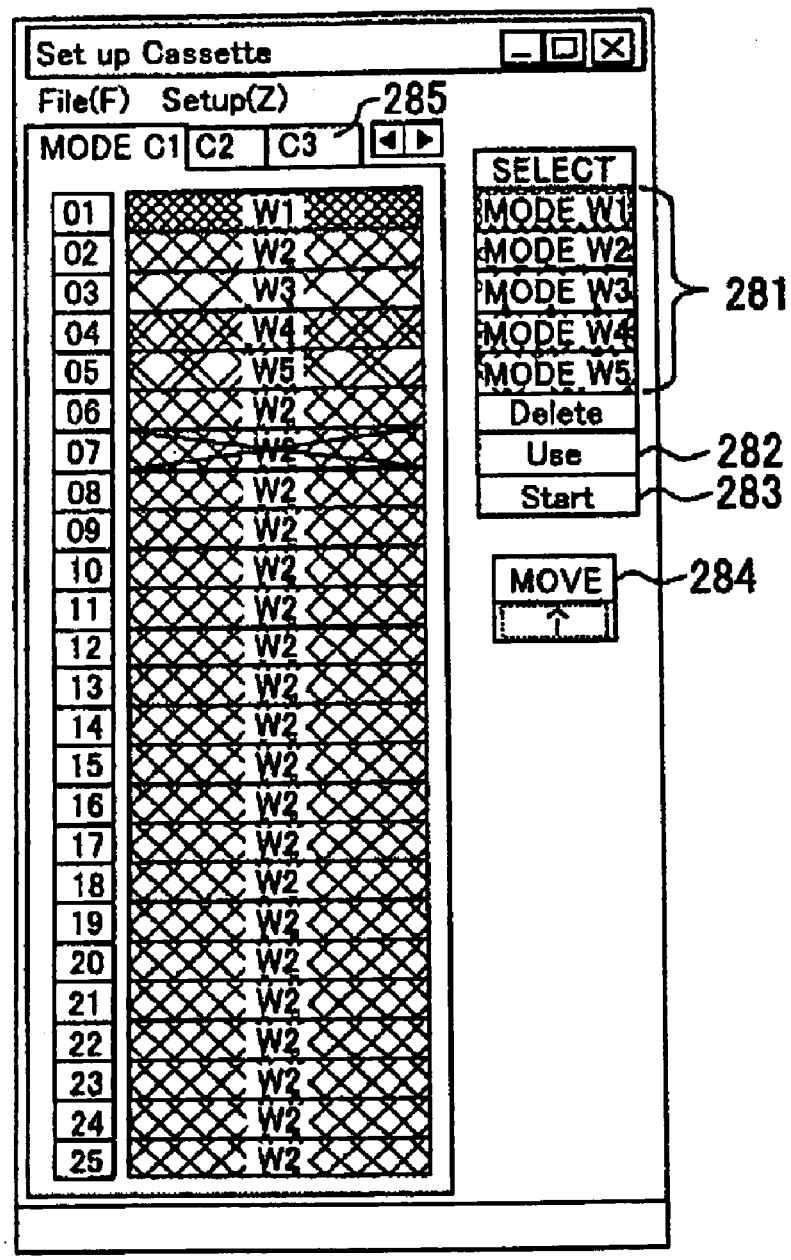
FIGS. 28A–B are diagrams showing one example of the cassette setting window.
Figure 28B:
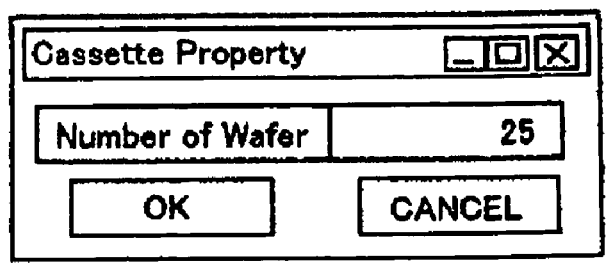

FIG. 28 shows the window for explanation of the cassette setting. First, a user chooses "Setup" command to display the cassette property window as shown in FIG. 28B, and then sets the possible number of wafers accommodated in a cassette. Then, the user chooses and sets for each wafer MODEs W1–W5 set in the wafer setting 53. Moreover, the user chooses and sets START 282, Usr 283, MOVE 284 and others. In this cassette setup window, the user can also set up five different cassette conditions by choosing tab 285. Further, with the "File" command, the measurement conditions concerned with the cassette setting can be loaded from the files recording all the measurement conditions. Storing (output to a file) of the measurement conditions in the cassette setting is performed in the main setting window.

As mentioned above, when setting the cassette setting 52-measurement sequence setting 55, a user returns to the main setting window in FIG. 4A, and then, with "Parameter" command in the menu bar, saves as a whole in a file all the measurement conditions that were set at each window. In addition, when reading out the measurement conditions stored as a whole at each of the setting window, only the measurement conditions corresponding to the setting window are read. Accordingly, managing file of the measurement conditions becomes easy, and as only the required measurement conditions are read in so that they are easy to distinguish and can be set by converted data.

[Measurement Execution Mode]

Next, the measurement execution mode will be explained. Returning to the main setting window as shown in FIG. 4, when a user chooses the measurement execution mode (Measure) from the pull down menu, the main setting window will be switched to the display contents as shown in FIG. 4B. FIG. 4B indicates the conditions where two locations for cassettes are provided for a prober. At this window, when a user chooses USER, Lot No, Parameter File, MODE and then Start, the control system commence measuring based on the measurement conditions designated. LOAD is for loading the file specified by Parameter File so as to identify the measurement conditions prior to the measurement, and thereby, contents of the loaded file renew the cassette setting window, the wafer setting window, the die setting window, and the measurement sequence setting window. Here, the LOAD is used for identifying the measurement conditions prior to measurement, an actual measurement is initiated when the file designated with Parameta File is loaded.

Figure 29:
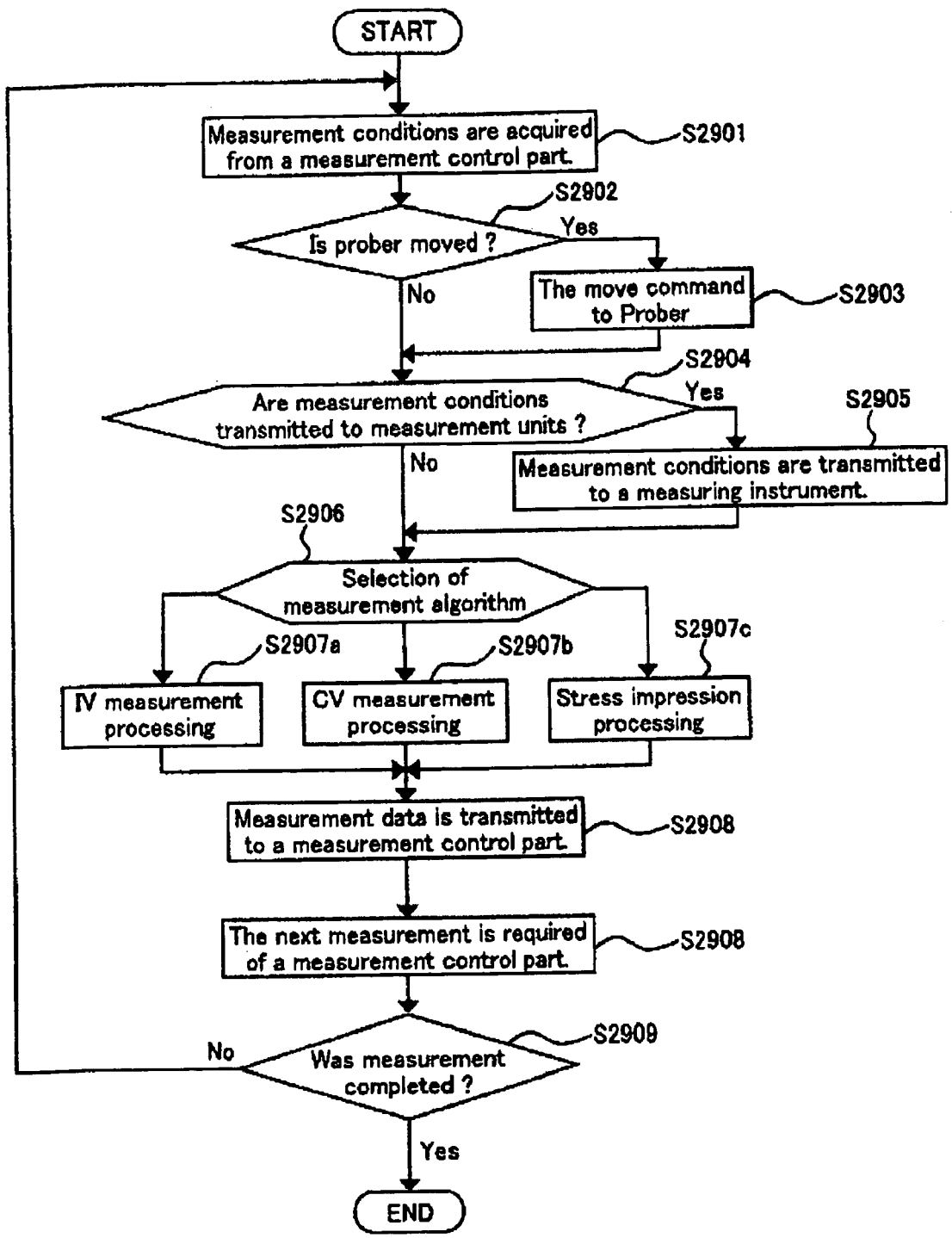
FIG. 29 is a flowchart for explaining the operation at the execution of the measurement in the control system.

FIG. 29 is a flow chart for explaining operation of the control system regarding this embodiment. As shown in FIG. 29, when commencement of the measurement is instructed, the measurement execution part 23 sends a request for transferring the measurement conditions to the measurement control part 22 to receive the measurement conditions from the measurement control part 22(S2901). Based on the acquired measurement conditions, the measurement execution part 23 determines whether or not it is the instruction for transferring prober 2 (S2902), and provides with an instruction to transfer to the prober 2 when determining that it is a instruction for transferring prober 2 (S2903). Further, the measurement execution part 23 determines whether or not the measurement conditions should be transferred to either of the measurement units 4 (S2904), and transfers the measurement conditions to the corresponding measurement unit 4 when determining that they should be transferred (S2905).

Next, the measurement execution part 23 selects the measurement algorithm according to the measurement conditions (S2906), and outputs an instruction of measurement to the measuring unit 4 (S2907a–2907c). Here, the measurement algorithm means either of the processes: the IV measurement processing, the CV measurement processing, or the stress application processing, those of which are specified with Mes Type 222 and Stress Type 221 shown in FIG. 22 and others. When being received the measurement instruction, the measurement unit 4 conducts the measurement to comply with the measurement algorithm, and then transfers the measurement data to the measurement execution part 23. The measurement execution part 23 transfers the measurement data obtained from the measuring unit 4 to the measurement control part 22 (S2908). The measurement control part 22 receives these data and stores in the memory unit 26, a hard disk and the like, to display on the output unit 27 such as a display and the like. The measurement execution part 23 transfers a requirement for the measurement conditions of the next measurement to the measurement control part 22 (S2909), and terminates the measurement when determining that all the measurement conditions set by the measurement control part 22 are executed.

For the operations above, it is sufficient to create each one of the algorithms, such as the IV measurement, the CV measurement, the stress application measurement and the like, because the measurement algorithm can be chosen for every measurement sequence, for example, even when performing sequence b and sequence c.

Figure 30:
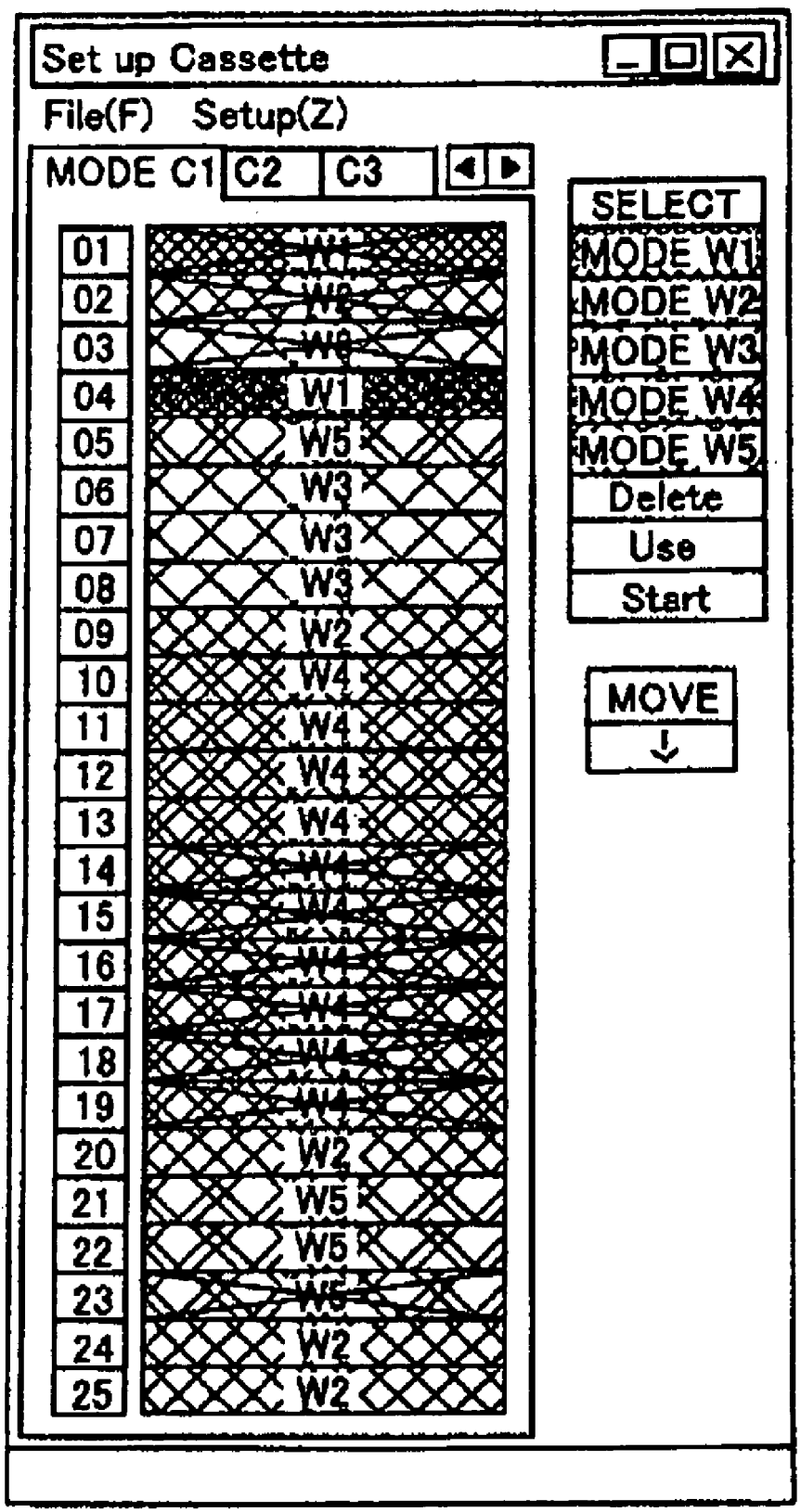
FIG. 30 is a diagram showing one example of the cassette setup window at the measurement execution mode.
Figure 31:
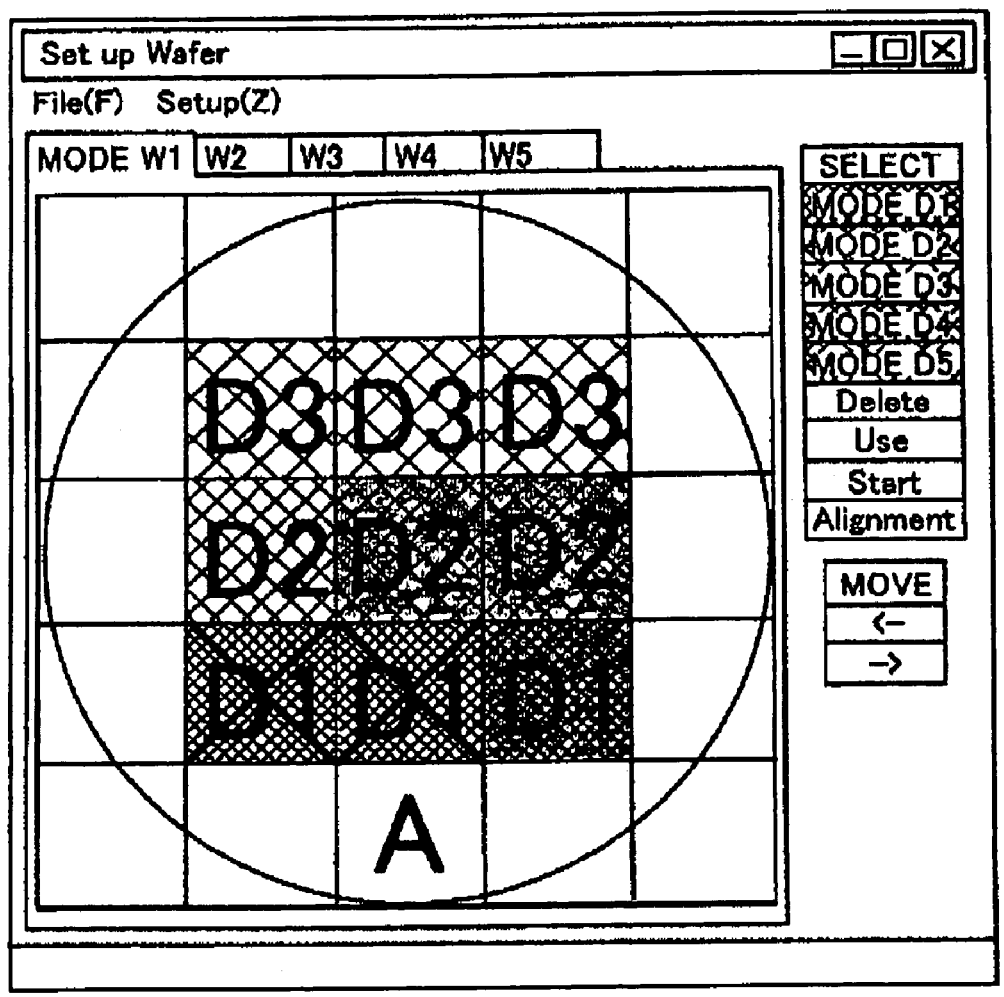
FIG. 31 is a diagram showing one example of the wafer setup window at the measurement execution mode.

During measurement, the control system displays in the status area 42 of this window in real time the subject cassette for the measurement, the wafer number taken out from the cassette, the X-Y coordinates of the die measured on the wafer, the directory name of the sub-site measured on the stage, and the mode of measurement algorithm, as shown in FIG. 4B. In addition to this window, the control system is able to display the cassette setting window (FIG. 30), the wafer setting window (FIG. 31), the die setting window (FIG. 32), and the sequence setting window (FIGS. 33 and 34). In each of these windows, the status of progress in measurement is indicated to a user with the objects indicating the subject measurement in a visually distinguishable manner. In this example, as shown in this figure, the object indicating the subject measurement is displayed as a dent on the screen. Here, FIG. 34 shows the display of measurement execution mode in the measurement sequence c. That is, the number of times of stress application is displayed in NO, the period of applying stress is displayed in Add, and the total time of stress application is displayed in Sum in the figure.

[Mode of Data Analyis]

Figure 35:
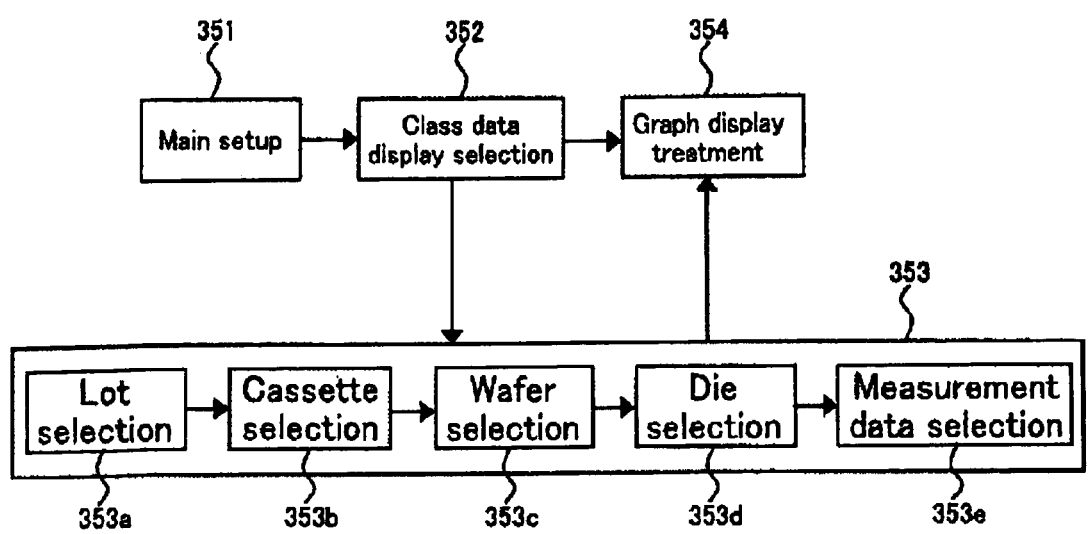
FIG. 35 is a diagram for explaining the mode of data analyzing.

Next, the data analysis mode will be explained. FIG. 35 is a diagram for explanation of the data analysis mode. In the data analysis mode, there are main setting 351, class (hierarchical) data display selection 352, data selection 353, and graph display treatment 354, and in the data selection 353, there are lot selection 353a, cassette selection 353b, wafer selection 353c, die selection 353d, and measurement data selection 353e. As explained later, when only one measurement datum is chosen in the class data display selection 352, the display setting 354 is called directly to display a graph based on the measurement datum. On the other hand, when the class having hierarchically higher level, which includes two or more measurement data, is chosen, the selection window corresponding to the data selection 353 is called and then, the graph display processing 354 is called after the data used for analysis in this window is chosen.

In the main setting window as shown in FIG. 4, the main setting window is switched over to the display contents shown in FIG. 4C when a user chooses the data analysis mode from the pull-down menu. By selecting either of "Directory", "Lotto", "Cassette", "Wafer", "Die", "Sequence," and "Graph," the user is able to display their display and by setting the analysis conditions therefor, is able to analyze a variety of complicated analysis to display the results in a graph and the like.

Figure 36:
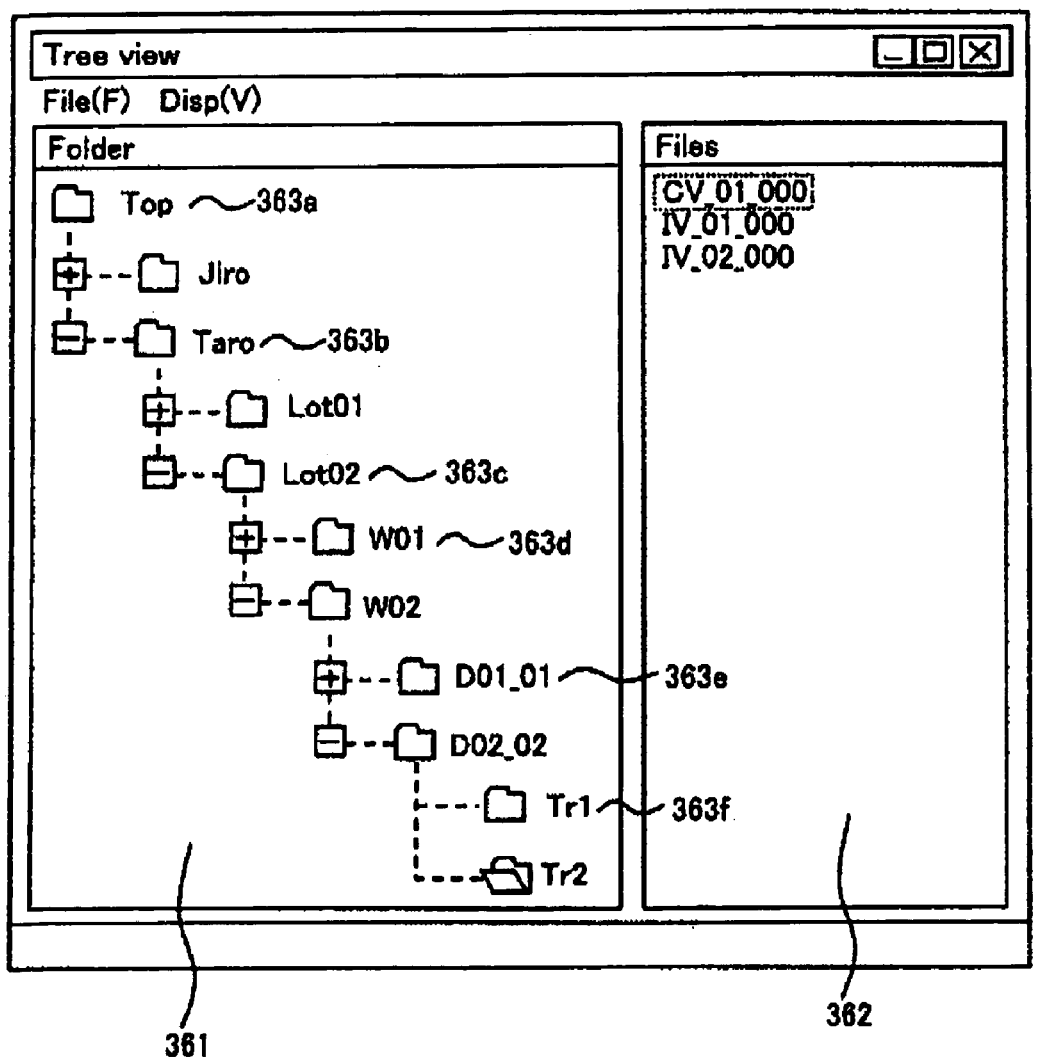
FIG. 36 is a diagram showing an example of the display window of class data.
Figure 38A:
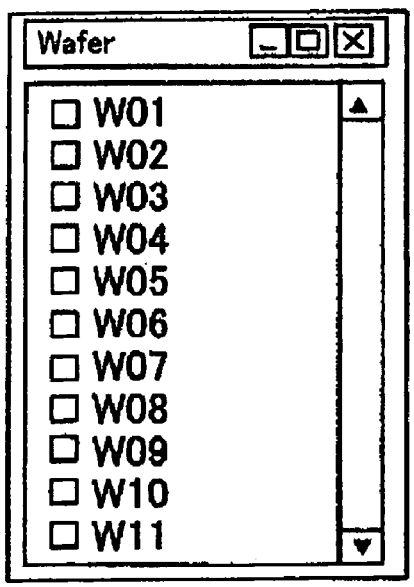
FIGS. 38A–D are diagrams showing another example of the analyzing data setting window.
Figure 38B:
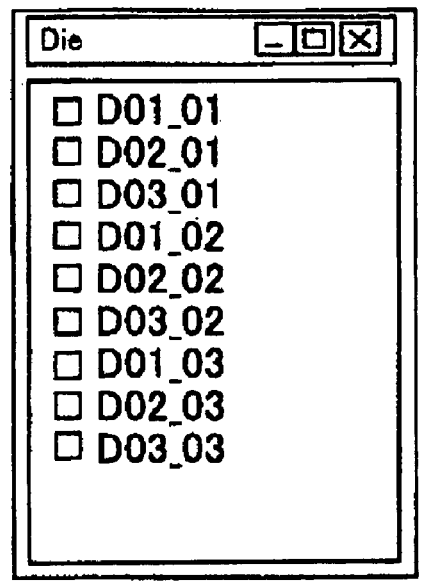
Figure 38C:
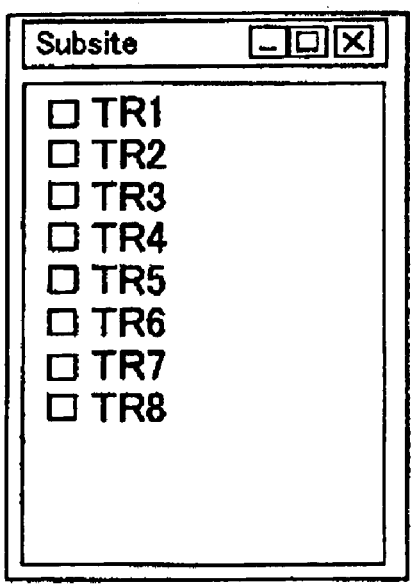
Figure 38D:
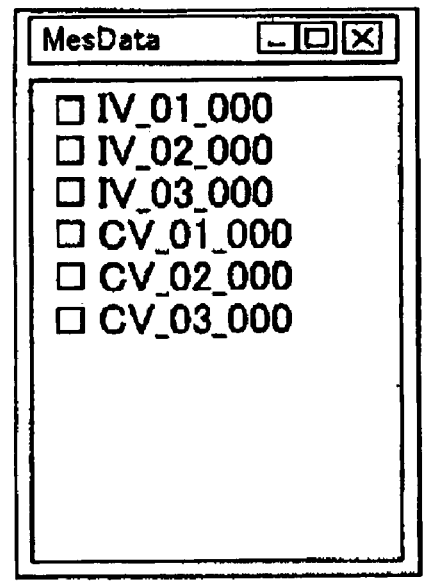

FIG. 36 is a figure showing an example of the class date display window. The class data display window shown in this figure has the tree view area 361 and the detailed information display area 362. The tree view area 361 displays the user, the lot, the wafer, the die, the sub-site, and the structure of file (data) for the measurement data in a hierarchical way employing the objects, and the detailed information display area 362 displays the detailed information (for example, the contents of a file in a folder) about the object specified in the tree view area 361. The output file (Data Name) set in the measurement sequence setting window (FIG. 22) is displayed here. When the user chooses the object, which is displayed at the detailed information display area, i.e. CV_01_000, the control system displays a graph in accordance with the display form designated for the file.

When a user chooses either of the objects in the tree view area 361, the control system displays the corresponding data selection window. For example, the window in FIG. 37A is displayed when a user chooses the object Top 363a, the window in FIG. 37B is displayed when the user chooses any of the user's objects 363b, and the window in FIG. 37C is displayed when the user chooses any of the lot objects 363c. The window here is the lot selection window, whose parameters capable of being be altered corresponding to the selected object at the class data display window are changed. Namely, the user is able to set to all the parameters from the window as shown in FIG. 37A, to set the parameters other than USER 371 from the window as shown in FIG. 37B, and to set the parameters other than USER 371 and Lot No. 372 from a window as shown in FIG. 37C. After selecting the parameters, the user returns to the main setting window and selects the analysis result display 43. Then, the control system displays a graph based on the measurement data.

In addition, when a user chooses the object wafer 363d from the class data display window in FIG. 36, the control system displays a window shown in FIG. 27. In this window, the user is able to set the die to be used for analysis by selecting Use 273.

When the user chooses the object die 363e in the class data display window in FIG. 36, the control system displays a window as shown in FIG. 25. In this window, the user is able to set the sub-site to be used for analysis by selecting Use 254.

When the user chooses the object sub-site 363f in the class data display window in FIG. 36, the control system displays the measurement sequence setting window as shown in FIG. 22 and the like. Namely, when NotUse is designated in the Stress Type 221, the measurement sequence window as shown in FIG. 22 is displayed, while when Stress is designated, the measurement sequence setting window as shown in FIG. 23 is displayed. The user can set the measurement data to be used for analysis by selecting Use in the window. Further, In the window as shown in FIG. 23, by setting Stress Sequence (for example, selected a step in a check box form), the measurement data used for analysis in the stress sequence can be set.

In the abovementioned settings, as well as the firstly displayed settings, the settings for the lower level are possible. Namely if a user chooses the wafer 363d, the wafer selection screen 353c is displayed to set the die to be used, and also enables to set the die selection 353d and the measurement data selection 353e having the lower level.

In this embodiment, the analysis data are set by use of a window for the measurement data setting, but another window as shown in FIGS. 38A–D can be used for setting.

Figure 39:
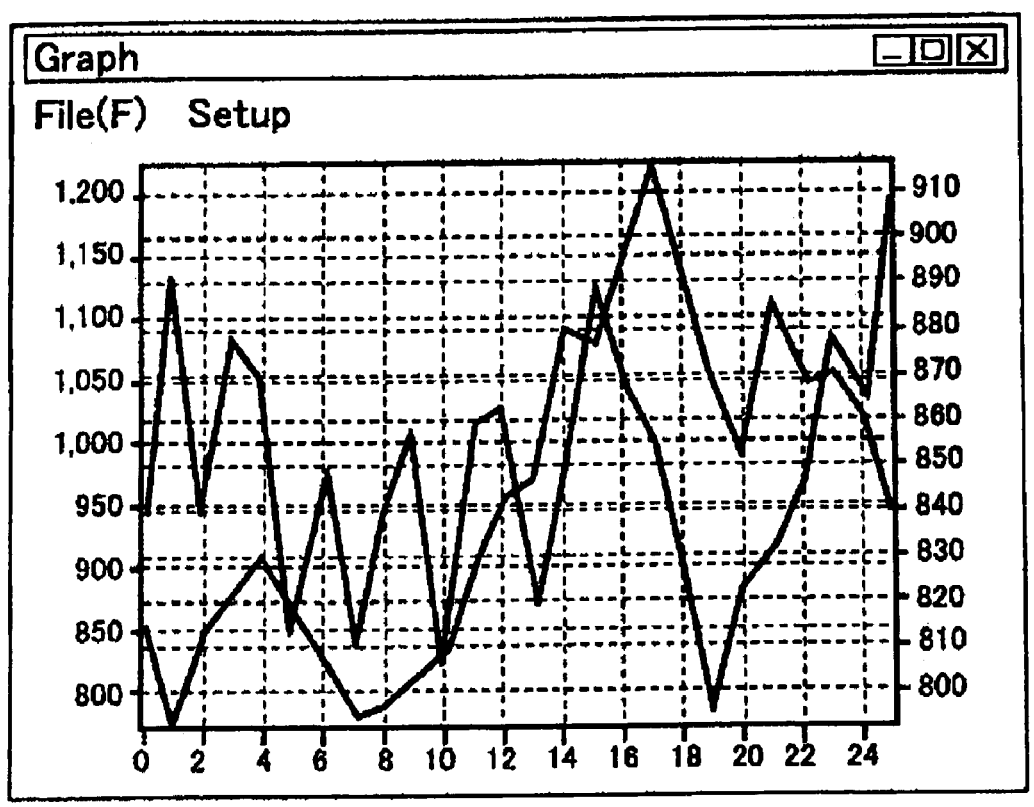
FIG. 39 is a diagram showing one example of the graph display window.

Next, display of the analysis results will be explained. After setting the data analysis in the data analysis mode, when a user returns to the main setting window in FIG. 4C and chooses the analysis result display 43, the control system indicates a graph based on the measurement data and the setup display conditions. If the user chooses "Graph" in the "Disp"(lay) command in the menu bar of the main setting window, the graph display window as shown in FIG. 39 is displayed.

Figure 40A:
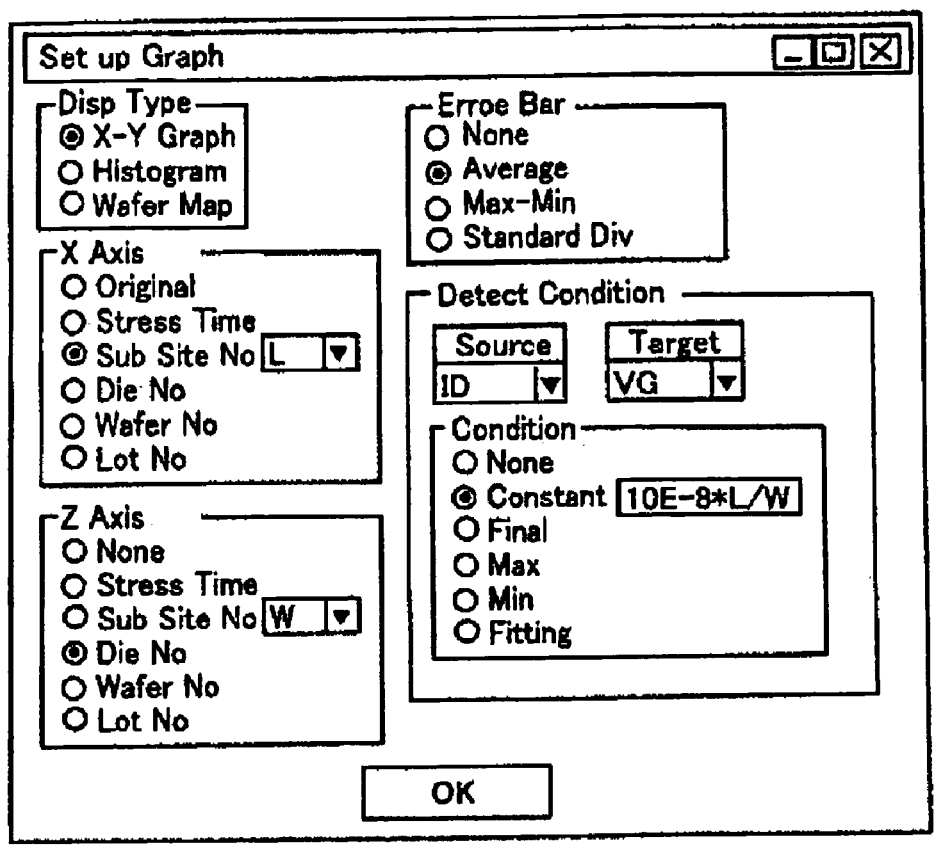
FIGS. 40A–B are diagrams showing one example of the graph display setting window.
Figure 40B:
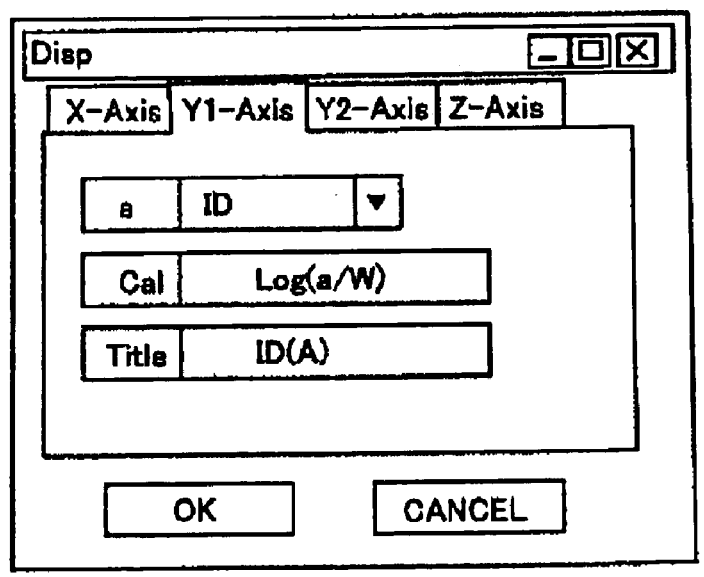

FIGS. 40A–40B are setting windows for setting the display method of the analysis conditions and the analysis results based on the analysis conditions.

In the class data display window (FIG. 36), when a user chooses an object displayed in the detailed information display area 362, namely when the total number of the selected measurement data is only one, the control system displays a graph, for example, as shown in FIG. 42A. Moreover, the window displayed when the lot 363a is selected has one line data and the selected wafer W, the die D, the sub-site S, and the measurement sequence is respectively one, the control system also displays a graph as shown in FIG. 41A.

On the other hand, when Add is set for Disp in the measurement sequence setting window, the control system displays a graph as shown in FIG. 421B.

Figure 41C:
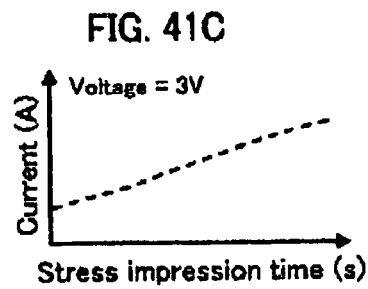
Figure 41D:
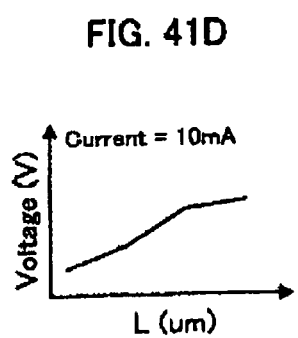
Figure 41E:
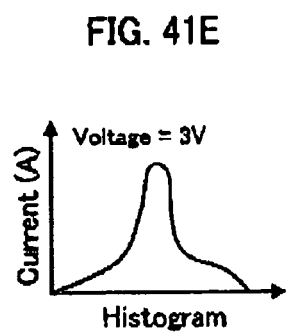
Figure 41F:
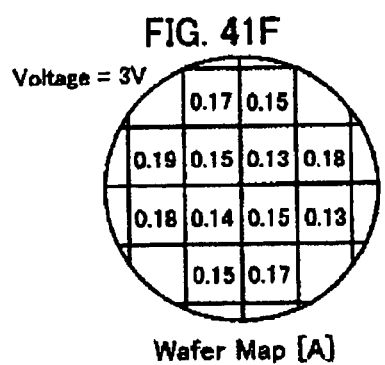
Figure 41G:
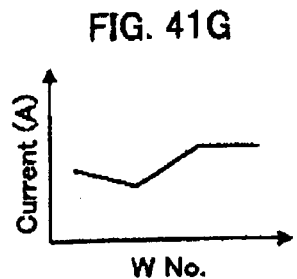
Figure 41H:
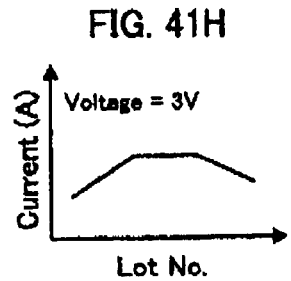
Figure 41I:
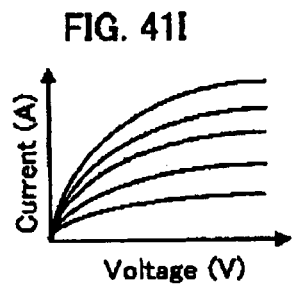
Figure 41J:
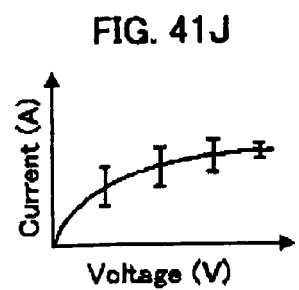

Further, if a user designates two or more data, a graph as shown in FIG. 41I is displayed. Here, if the user chooses "Average" in the Error Bar as shown in FIG. 40A, the average value of all data is displayed like FIG. 41A, and if "Max-Min" and "Standard Dev" are selected, the average value is displayed with Error Bars of maximum and minimum value or the standard deviation as shown in FIG. 41J.

Furthermore, according to the setting of "Detect Condition" as shown in FIG. 40A, one value can be extracted from the measurement data. For example, the data for the IV measurement, taken by sweeping voltage, consists of voltage (X-axis) and current values (Y-axis) having the number of steps of swept voltage. As shown in the figure, when ID at Source, VG at Target, and Constant at Condition are respectively selected and "10E–8·L/W" as the formula setting at the right of the Constant, the VG value is extracted where current value (ID) is the formula "10E–8·L/W." Here, each different value for each site set in FIG. 26B is input for L and W. Thus, since the value related with each site is used in the formula, single notation is uniformly applied to all the site even when a certain value is detected based on the value corresponding to the size of a measured device.

In accordance with the procedure above, a total sum of the value extracted from all the data is displayed on a graph in a form in the selected "X-Axis" and "Z-Axis." In the "X-Axis" the display form for the horizontal axis is designated to calculate total sums for each item designated in the "Z-Axis" and to display the results as two or more lines. Moreover, the detected value is displayed on the vertical axis.

By using the measurement data of Sequence c as shown in FIG. 21 to set "Stress Time" for the condition of the X axis, a graph shown in FIG. 41C where stress time is plotted in the horizontal axis is displayed, and if "Sub-site No," "Die No," "Wafer No," and "Lot No" are selected, graphs as show in FIG. 41G and H are displayed. By selecting "Sub-site No" and then selecting at its right part "Time," "Area," "L," "W," or "Ox Thick," all of which are associated with in FIG. 26B, the horizontal axis having the associated value can be displayed at the site. For example, if "L" is selected, the graph of FIG. 41D can be displayed.

In addition, if a user chooses "X-Y Graph" at the Disp Type, then a graph of X-Y axis as in the above is displayed, if chooses "Histogram," a graph shown in FIG. 41E is displayed, and moreover, if chooses "Wafer Map," a graph shown in FIG. 41F is displayed.

The form of graph display is set and altered in the display shown in FIG. 40B. In the same figure, when "Cal" is designated to the formula, then results calculated according to the formula are out put. For that formula, "Time," "Area," "L", "W," or "Ox Thick" and the like others, which are linked in FIG. 26B can be used and the description without relying on the site can be done. For example, if current value per W is to be displayed, the desired value can be displayed by setting "a/W" (here a is the measurement data) without change its setting, even when data for different transistor are selected. As well, the value related with the site can be provided in a reference table separately.

[Advantage of Embodiment]

As mentioned above, the present embodiment has the advantage as follows:

(1) In setting the measurement parameters, since the setting windows are hierarchically arranged for each candidate for a setting and the setting in hierarchically lower level can be used for the setting in higher level, the measurement conditions can be set systematically. The settings of even a complicated algorithm are conducting easily.

Moreover, in the settings for the cassette setting 52 to the measurement sequence setting 55, a user stores all the measurement conditions in a file as a whole, and when loading the stored measurement conditions in the file as a whole in each of the setting windows, the measurement conditions corresponding to the setting window, so that the file management of the measurement conditions becomes easy and visually understandable as only the measurement conditions necessary in that setting window is loaded, and so that setting with data converted is also easy.

(2) As the setting window optimized for each measuring unit is prepared, the user is able to conduct intuitional settings complying with the specific characteristics of the measuring unit.

(3) As the measurement conditions set for each measurement unit can be individually selected in the measurement sequence setting, settings corresponding to various kinds of the measurement sequences are easily conducted. And as the measurement modes and the parameter files are independently selected, the contents of the measurement sequence becomes easy to grasp. Moreover, by individually providing the setting items of the stress sequence and measurement sequence at the measurement sequence setting, during repeated execution of measuring the designated measurement several times or applying stress and the like, the measurement sequences repeatedly executing the designated same measurement two or more times can be easily set between them. In addition, in the stress application repeatedly conducted, modifying the stress application conditions and setting the suspend conditions of the stress application can be set so that complicated stress application can be easily executed.

(4) As the location information of the sub-sites and DIR NAME, for example, are associated together so as to be selectable of the subject for the association, even if the location information of the sub-site is changed, the measurement and the data analysis can be done without mistakenly recognized.

(5) In the data analysis mode, as the measurement data are hierarchically displayed for each of the measurement subjects, the measured data to be analyzed can be easily selected.

(6) For the extraction formula for the analysis, the value related with the site can be used. As a result, even if the extraction conditions defer for each site, the notation can be uniformly described for analysis at a time. Further, at the graph display, the value associated with the site can be used for the formula for display. Thus, even if the formula differs for each site, uniform description can be maintained.

(7) As the program for executing the test mode comprises the measurement control part and the measurement execution part independently, even if the structure of the semiconductor evaluation device is to be changed, it flexibly deals with the change by modifying the communication figuration between these individual programs.

(8) When the program realizing the measurement execution part of these programs id described in an interpreter-base programming language such as BASIC and the like, which is easily edited, and the other programs are created with compiler-base programming language such as C language and the like, which expects high speed execution but not easily edited, then it flexibly deals with design changes while satisfies the requirements for high-speed execution of the control system.

[Other Embodiments]

The embodiments above are merely exemplified for explaining the present invention, but not limit the scope of the present invention to these embodiments. The present invention can be modified in another embodiment within the scope of the present invention.

In the embodiment above the prober of full automatic type that full-automatically measures a wafer by taking a wafer one by one out of the cassette C accommodating a number of wafers and placing on the prober, the present invention can be applied to the prober of semi-automatic type, where a wafer is placed by hand on by one and measured automatically, or the prober of manual type, which is measured by hand.

In the prober of semi-automatic type, there are three setup methods as follows: The first one is the setup method that is made to select a Wafer number in addition to the selection of MODEs C1–C5 in the window as shown in FIG. 4B. The second is the setup method that is made to select a Wafer number directly without the selection of MODEs. The third is the setup method that is made to select the MODEs C1–C5 and a wafer number in the Cassette setting. In this method, the MODEs C1–C5 are selected in the tub arranged first and a Wafer number in the window shown in FIG. 28.

For the prober of manual type, there are also three setup methods as follows: The first one is the setup method by using the measurement sequence setting window (FIG. 22 or FIG. 23). In this case in Data Name 225 it is desirable to designate the destination to store in detail at its directory level. The second is the setting method by using the present measurement sequence setting window and the die setting window (FIG. 25). According to this setting method, when the sub-site S exists, the parameters relying on the sub-site S can be set at the time of the measurement in the window as shown in FIG. 26B. The third one is the setting method that selects MODEs C1–C5 and a Wafer number in the Cassette setting, and MODEs W1–W5 and the die D in the wafer setting window, and further the sub-site S in the die setting window.

Moreover, it is preferable if the control system provides the full automatic mode, semi automatic mode, and manual mode as the measurement implementation mode. Here, the full automatic mode means the mode for measuring automatically a plurality of wafers contained in the cassette C and the semi automatic mode means the mode for measuring automatically a plurality of dies D contained in single wafer W. And the manual mode is the mode for measuring each element (sub-site S).

Figure 42:
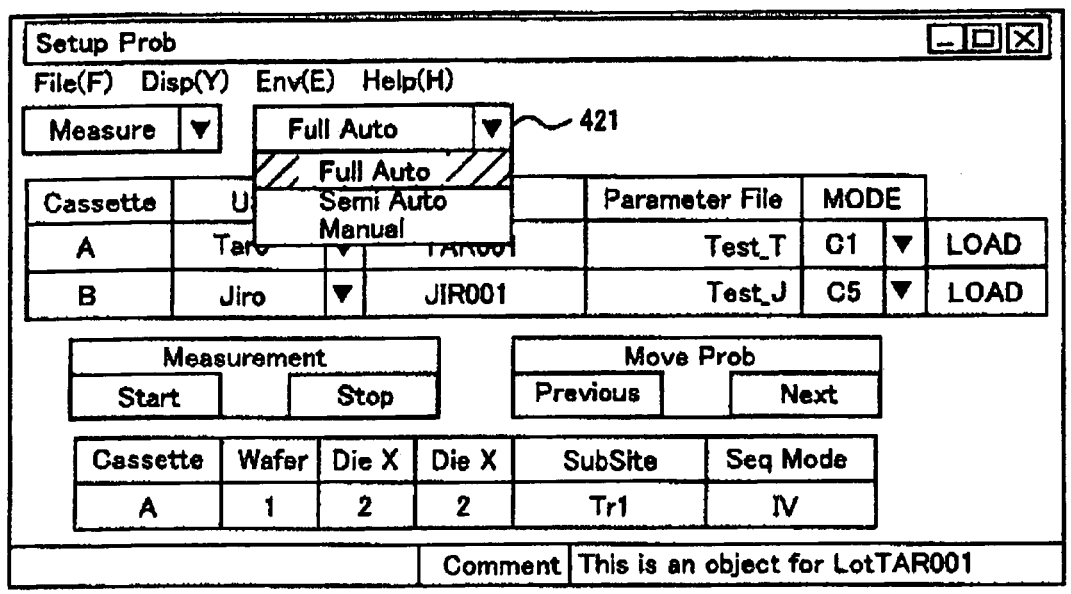
FIG. 42 is a diagram showing one example of the switch menu of the measurement execution mode at the main setting window.
Figure 43:
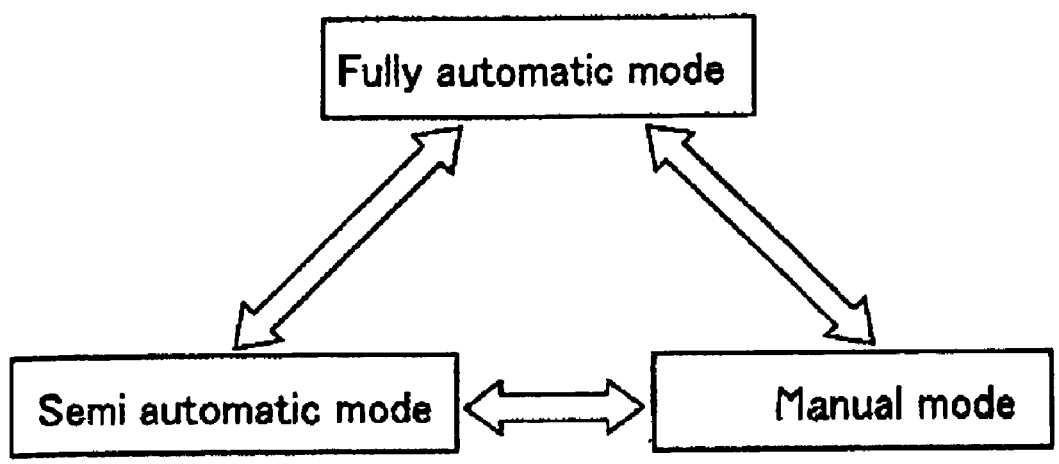
FIG. 43 is a diagram to explain the transferring motion between each mode at the measurement execution mode.

Exchange between these measurement execution modes are instructed in the main setting window. FIG. 42 is a diagram showing one example of a switchover menu for the measurement execution mode in the main setting window. At the time of the measurement, a user can choose any one of the desired measurement execution modes in the switchover menu 421 to smoothly go and back between each mode as shown in FIG. 43.

As a result, one can smoothly move to the manual mode with an uniformly organized operational environment without using another specific program for manual measurement as in the prior art, even if, for example, after measuring all the wafers W in the full-automatic mode, re-measurement has to be done for sole one point.

As explained above, the present invention enables one to operate systematic and intuitive settings necessary for evaluating the characteristic of semiconductor elements and for outputting the evaluation results based on the measured data, so that the operationality is improved.

The invention claimed is:

1. A semiconductor evaluation device which evaluates the characteristics of semiconductor elements on a wafer, comprising:
    means for managing the settings in and display of a setting window in order to perform setting of measurement conditions for each setting referent having a hierarchical relationship;
    means for displaying a main setting window to manage said setting window;
    means for storing, in a file, measurement conditions set in said setting window; and,
    means for displaying measurement conditions, set in said setting window for a setting referent on a relatively lower hierarchical level and stored in said file, in said setting window for said setting referent in a hierarchical level higher than said lower-level setting referent; and wherein
    the user can selectively append to and modify the measurement conditions displayed in the setting window for said higher-level setting conditions.

2. The semiconductor evaluation device according to claim 1, wherein said setting window is at least one among a cassette setting window, a wafer setting window, a die setting window, a measurement sequence setting window, a measurement equipment setting window, and a switching matrix setting window.

3. The semiconductor evaluation device according to claim 2, wherein measurement conditions set in said setting window based on operations on said main setting window are stored at once in said file.

4. The semiconductor evaluation device according to claim 1, wherein said setting window comprises a measurement sequence setting window, and said measurement sequence setting window is configured to enable the independent setting of a measurement mode, and parameters for the measurement mode.

5. The semiconductor evaluation device according to claim 1, wherein, for each of the measurement conditions set for said setting window, whether the measurement conditions are used or not is stipulated individually.

6. The semiconductor evaluation device according to claim 1, wherein said setting window comprises a measurement sequence setting window, and a plurality of measurement sequences are selectably displayed on a single screen.

7. The semiconductor evaluation device according to claim 1, wherein said setting window comprises a measurement sequence setting window, said measurement sequence comprises a stress application sequence, and the stress application conditions of the stress application sequence can be modified or interrupted.

8. A semiconductor evaluation device which evaluates the characteristics of semiconductor elements on a wafer, comprising:
    means of displaying a measurement condition setting window to perform setting of measurement conditions for each of a plurality of sub-sites formed on said wafer;
    means of executing measurements of said semiconductor elements, based on measurement conditions set in said setting window, and obtaining measurement data; and,
    means of analyzing said measurement data, based on analysis conditions set in said analysis condition setting window in order to set analysis conditions for measurement data obtained from said semiconductor elements; and wherein
    said analysis condition setting window relates the measurement conditions set in said measurement condition setting window to analysis conditions.

9. The semiconductor evaluation device according to claim 8, wherein a method of display of a graph which is the analysis results for said measurement data can be set, and an expression can be set as a condition for displaying said graph.

10. The semiconductor evaluation device according to claim 9, wherein said means for analysis of measurement data outputs the analysis results of the measurement data to a file.

11. The semiconductor evaluation device according to claim 8, wherein a method of display of a graph which is the analysis results for said measurement data can be set, and a summation method for displayed data can be selectably set for each axis of the graph as a condition for displaying said graph.

12. A computer-readable program product to realize a user interface of a semiconductor evaluation device which evaluates the characteristics of semiconductor elements on a wafer, comprising:
    instructions to manage the settings in and display of a setting window to perform setting of measurement conditions for each setting referent having a hierarchical relationship;
    instructions to display a main setting window to manage said setting window;
    instructions to store, in a file, measurement conditions set in said setting window;
    instructions to display measurement conditions, set in said setting window for a setting referent on a relatively lower hierarchical level and stored in said file, in said setting window for said setting referent in a hierarchical level higher than said lower-level setting referent; and,
    instructions enabling the user to selectively append to and modify the setting conditions displayed in the setting window for said higher-level setting conditions.

13. A measurement condition setting method in a semiconductor evaluation device which evaluates the characteristics of semiconductor elements on a wafer, wherein:

a setting window for a relatively lower-level setting referent is displayed, and the user is prompted to set prescribed measurement conditions;

measurement conditions set by said user in said setting window for said lower-level setting referent are stored in a file; and, said stored measurement conditions are read and displayed based on operations on a setting window for a setting referent on a higher hierarchical level than said lower-level setting referent, and selectively appended and modified settings are made possible by said user.

14. A semiconductor evaluation device which evaluates the characteristics of semiconductor elements on a wafer, comprising:

means for displaying, on one screen, a plurality of objects indicating setting referents having a hierarchical relationship, according to said hierarchical relationship;

means for displaying, when any of said objects is selected by a user, a setting window for said selected object; and, means for analyzing measurement data obtained from prescribed measurement equipment according to analysis conditions set in said setting window.

15. A computer-readable program product to realize a control system in a semiconductor evaluation device which evaluates the characteristics of semiconductor elements on a wafer, comprising:

a setting procedure to set measurement conditions for each of a plurality of setting referents having a hierarchical relationship;

a measurement execution procedure to control specific measurement equipment which performs measurement of said semiconductor elements; and, a measurement control procedure to control said measurement execution function based on measurement conditions set by said setting function; and wherein said measurement execution procedure and said measurement control function are each realized by independent programs.

* * * * *